(12) United States Patent
Kong et al.

(10) Patent No.: US 8,719,669 B2
(45) Date of Patent: May 6, 2014

(54) ERROR CORRECTION DECODER AND ERROR CORRECTION METHOD THEREOF

(75) Inventors: JaePhil Kong, Seoul (KR); Yongwon Cho, Seoul (KR); Changduck Lee, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 112 days.

(21) Appl. No.: 13/433,796

(22) Filed: Mar. 29, 2012

(65) Prior Publication Data

US 2012/0254705 A1    Oct. 4, 2012

(30) Foreign Application Priority Data

Mar. 29, 2011    (KR) .................. 10-2011-0028318

(51) Int. Cl.
*G11C 29/00*    (2006.01)
*H03M 13/00*    (2006.01)

(52) U.S. Cl.
USPC .......................................... 714/772; 714/781

(58) Field of Classification Search
None
See application file for complete search history.

(56) References Cited

U.S. PATENT DOCUMENTS

| | | | | |
|---|---|---|---|---|
| 5,942,005 A * | 8/1999 | Hassner et al. | ............... | 714/784 |
| 7,237,183 B2 | 6/2007 | Xin | | |
| 7,870,468 B1 * | 1/2011 | Vanka et al. | .................. | 714/784 |
| 8,301,986 B2 * | 10/2012 | Jo et al. | ........................ | 714/785 |
| 8,479,085 B2 * | 7/2013 | Jo et al. | ........................ | 714/795 |
| 2006/0059409 A1 * | 3/2006 | Lee | ............... | 714/784 |
| 2008/0140869 A1 * | 6/2008 | Jo | ..................... | 710/8 |
| 2009/0070656 A1 * | 3/2009 | Jo et al. | ........................ | 714/763 |
| 2009/0217140 A1 * | 8/2009 | Jo et al. | ........................ | 714/785 |
| 2011/0314354 A1 * | 12/2011 | Fillingim | ..................... | 714/760 |
| 2012/0290901 A1 * | 11/2012 | Kong et al. | .................. | 714/781 |

FOREIGN PATENT DOCUMENTS

| | | |
|---|---|---|
| JP | 2003-273750 | 9/2003 |
| JP | 10-0733963 | 6/2007 |
| KR | 10-0214485 | 5/1999 |
| KR | 10-0733963 | 6/2007 |

OTHER PUBLICATIONS

English Abstract for Publication No. 10-0733963.
English Abstract for Publication No. 10-0214485.
English Abstract for Publication No. 2003-273750.

* cited by examiner

*Primary Examiner* — Daniel McMahon
(74) *Attorney, Agent, or Firm* — F. Chau & Associates, LLC

(57) ABSTRACT

An error correction code (ECC) decoder processing data read from a storage media includes a plurality of processing elements for detecting an error in at least one of a plurality of channel data, wherein the plurality of channel data is received via a plurality of channels, and wherein the plurality of processing elements are driven independently from the plurality of channels.

11 Claims, 16 Drawing Sheets

ERROR CORRECTION DECODER AND ERROR CORRECTION METHOD THEREOF

CROSS-REFERENCE TO RELATED APPLICATIONS

This application claims priority under 35 U.S.C. §119 of Korean Patent Application No. 10-2011-0028318, filed Mar. 29, 2011, the entire contents of which are hereby incorporated by reference.

BACKGROUND

1. Technical Field

The present disclosure relates to error correction, and more particularly to an error correction code decoder and method operating independently of communication channels.

2. Discussion of Related Art

Error detection and correction methods enable reliable delivery of digital data over communication channels. Errors may be introduced during transmission of data via the communication channels by a variety of means. Through the application of error detection techniques, these errors may be detected, while error correction enables reconstruction of the data to an original state without the errors.

SUMMARY

According to an exemplary embodiment of the inventive concept, an error correction code (ECC) decoder processing data read from a storage media comprises a plurality of processing elements for detecting an error in at least one of a plurality of channel data, wherein the plurality of channel data is received via a plurality of channels, and wherein the plurality of processing elements are driven independently from the plurality of channels.

According to an exemplary embodiment, at least one of the plurality of processing elements comprises a syndrome determination block configured to determine a syndrome for each of a plurality of channel data, wherein the plurality of channel data is received via a plurality of channels, respectively.

According to an exemplary embodiment at least one of the plurality of processing elements comprises a key equation solver (KES) block configured to obtain an error location polynomial for each of at least one of the channel data based upon the respective syndrome.

According to an exemplary embodiment at least one of the plurality of processing elements comprises a Chien search block configured to obtain a root of the error location polynomial.

According to an exemplary embodiment of the inventive concept, an error correction code (ECC) decoder processing data read from a storage media. The ECC decoder comprises a syndrome determination block configured to determine a syndrome for each of a plurality of channel data, wherein the plurality of channel data is received via a plurality of channels, respectively, a key equation solver (KES) block configured to obtain an error location polynomial for at least one of the channel data based upon the respective syndrome, and a Chien search block configured to obtain a root of the error location polynomials, wherein the KES block or the Chien search block is driven independently from the plurality of channels and includes at least one unit configured to process the channel data of a selected one of the plurality of channels.

According to an exemplary embodiment, the ECC decoder further comprises an ECC controller configured to control an operating time of the syndrome determination block, the KES block, and the Chien search block based upon a state of the KES block or the Chien search block.

According to an exemplary embodiment, the KES block comprises a plurality of KES units driven independently of the plurality of channels, and a state register configured to store a ready/busy state of each of the plurality of KES units.

According to an exemplary embodiment, the ECC controller assigns the plurality of channel data to the KES units based upon the ready/busy states.

According to an exemplary embodiment, the ECC decoder further comprises a first-in first-out buffer configured to output the syndromes provided from the syndrome determination block to the KES block.

According to an exemplary embodiment, a number of the plurality of KES units is less than a number of the plurality of channels.

According to an exemplary embodiment, the Chien search block comprises a plurality of Chien search units driven independently from the plurality of channels, and a state register configured to store a ready/busy state of each of the plurality of Chien search units.

According to an exemplary embodiment, the ECC decoder further comprises a first-in first-out buffer configured to output the error location polynomials provided from the KES block to the Chien search block.

According to an exemplary embodiment, a number of the plurality of Chien search units is less than a number of the plurality of channels.

According to an exemplary embodiment, the ECC decoder further comprises a channel priority information block configured to store priority information of the plurality of channels, a first first-in first-out buffer configured to output the syndromes provided from the syndrome determination block to the KES block according to the priority information, and a second first-in first-out buffer configured to output the error location polynomials provided from the KES block to the Chien search block according to the priority information.

According to an exemplary embodiment, the at least one unit is formed of one processing element.

According to an exemplary embodiment, the storage media includes a plurality of nonvolatile memory devices.

According to an exemplary embodiment of the inventive concept, a method of correcting an error of data read out from a nonvolatile memory device. The method comprises receiving channel data of a plurality of channels, respectively, determining syndromes of channel data corresponding to the plurality of channels, respectively, obtaining an error location polynomial of at least one of the channel data based upon the respective syndrome, and obtaining a root of the error location polynomial, wherein a determination based on a first channel data is carried out following a determination based on a second channel data, wherein the determination based on the first channel data and the determination based on the second channel data each comprise at least one of obtaining of the error location polynomial or obtaining the root of the error location polynomial.

According to an exemplary embodiment, the root of the error location polynomial of the first channel data is obtained upon determining obtaining the error location polynomial of the first channel data.

According to an exemplary embodiment, the obtaining of error location polynomials or the obtaining of roots of the error location polynomials is skipped with respect to channel data corresponding to a syndrome, in which no error exist, among the syndromes.

BRIEF DESCRIPTION OF THE FIGURES

Exemplary embodiments of the present disclosure will become apparent from the following description and accompanying figures in which like reference numerals refer to like parts throughout the various figures unless otherwise specified, and wherein.

DETAILED DESCRIPTION

Figure 1:
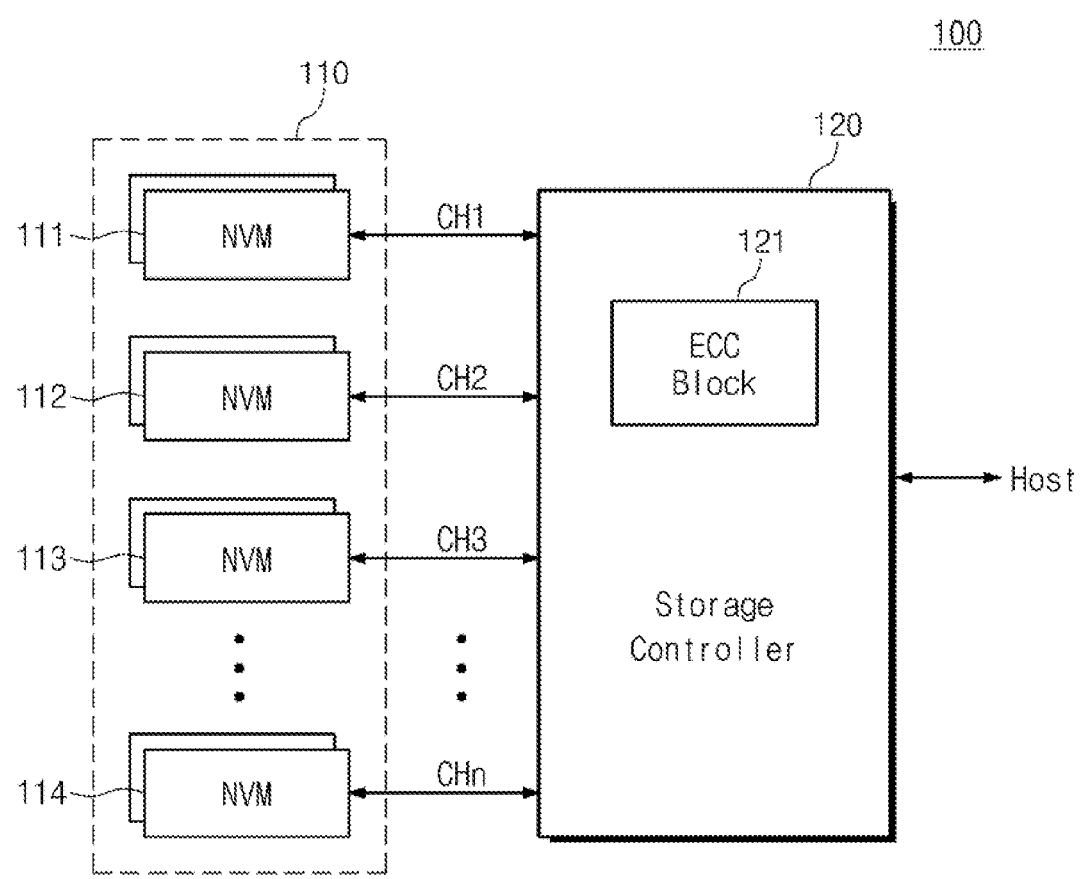
FIG. 1 is a block diagram illustrating a storage device according to an exemplary embodiment of the inventive concept.

Exemplary embodiments of the present disclosure will be described below in more detail with reference to the accompanying drawings. Inventive concepts described herein may, however, be embodied in many different forms and should not be construed as limited to embodiments set forth herein. Rather, exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a storage device according to an exemplary embodiment of the inventive concept. Referring to FIG. 1, a storage device 100 may include a storage medium 110 and a storage controller 120.

The storage medium 110 may include nonvolatile memory devices (NVM), e.g., 111 to 114. The storage medium 110 may be formed of, for example, a NAND-type flash memory with a mass storage capacity, a nonvolatile memory such as a PRAM (phase-change RAM), an MRAM (magnetoresistive RAM), a ReRAM (Resistive RAM), a FRAM (Ferroelectric RAM), etc., a NOR flash memory, or the like. The storage medium 110 is not limited to the exemplary memory devices described herein.

The storage medium 110 may exchange data with the storage controller 120 via a plurality of channels, e.g., CH1 to CHn. Data may be stored in the storage medium 110 under the control of the storage controller 120. Data stored in the storage medium 110 may be output to the storage controller 120 under the control of the storage controller 120. According to an exemplary embodiment of the inventive concept, data read from the storage medium 110 may be transferred via each channel.

The plurality of nonvolatile memory devices 111 to 114 included within the storage medium 110 may be connected with the storage controller 120 via respective ones of the plurality of channels CH1 to CHn. A first channel CH1 may be connected with input/output ports (e.g., eight I/O ports) of each of m nonvolatile memory devices 111 (m being an integer). The input/output ports of the m nonvolatile memory devices 111 may share the first channel CH1.

Remaining channels CH2 to CHn may be similar to the first channel CH1 such that input/output ports of a plurality of memory devices may share a corresponding channel. The nonvolatile memory devices 111 to 114 connected with the channels CH1 to CHn may be accessed in a channel interleaving method or a multi-way interleaving method, e.g., 4-way interleaving. With channel interleaving, when a direct memory access (DMA) operation of the memory devices 111 is completed, a DMA operation of the memory devices 112 may commence. That is, a program time tPROG or a read time may be hidden through the interleaving operation. During the program time tPROG, data provided to a memory device may be programmed in memory cells.

The storage controller 120 may be configured to interface with a host (not shown) and the storage medium 110. The storage controller 120 may write data provided from the host in the storage medium 110 in response to a write command of the host. The storage controller 120 may control a read operation of the storage medium 110 in response to a read command from the host.

The storage controller 120 may be configured to encode data to be written in the storage medium 110. The encoded write data may be written in each memory device of the storage medium 110. At a read operation, the storage controller 120 may be configured to decode data read out from the storage medium 110. The storage controller 120 may include an error correction code (ECC) block 121 configured to perform an error detecting and correcting operation, the error detecting and correcting operation may be performed independently with respect to the respective channels.

The ECC block 121 may include a syndrome determination block, a key equation solver (KES) block, and a Chien search block. The syndrome determination block may determine a syndrome S for detecting whether read data is erroneous. The KES block may generate an error location polynomial for obtaining a location where an error exists, based on the syndrome S. The Chien search block may execute an operation for obtaining a root of the error location polynomial.

The ECC block 121 may include a KES block and/or a Chien search block that is/are independent of the plurality of channels CH1 to CHn. The KES block may obtain an error location polynomial of read data transferred to any channel, based upon the syndromes obtained from the respective channels. Data output as a result of an error correcting operation may be output by a channel unit.

According to an exemplary embodiment of the inventive concept, in a KES block and/or a Chien search block independent of each channel, not dependent on each channel, the number of elements constituting the KES block and/or the Chien search block, and/or a peak current generated by an error correcting operation, may be reduced.

Figure 2:
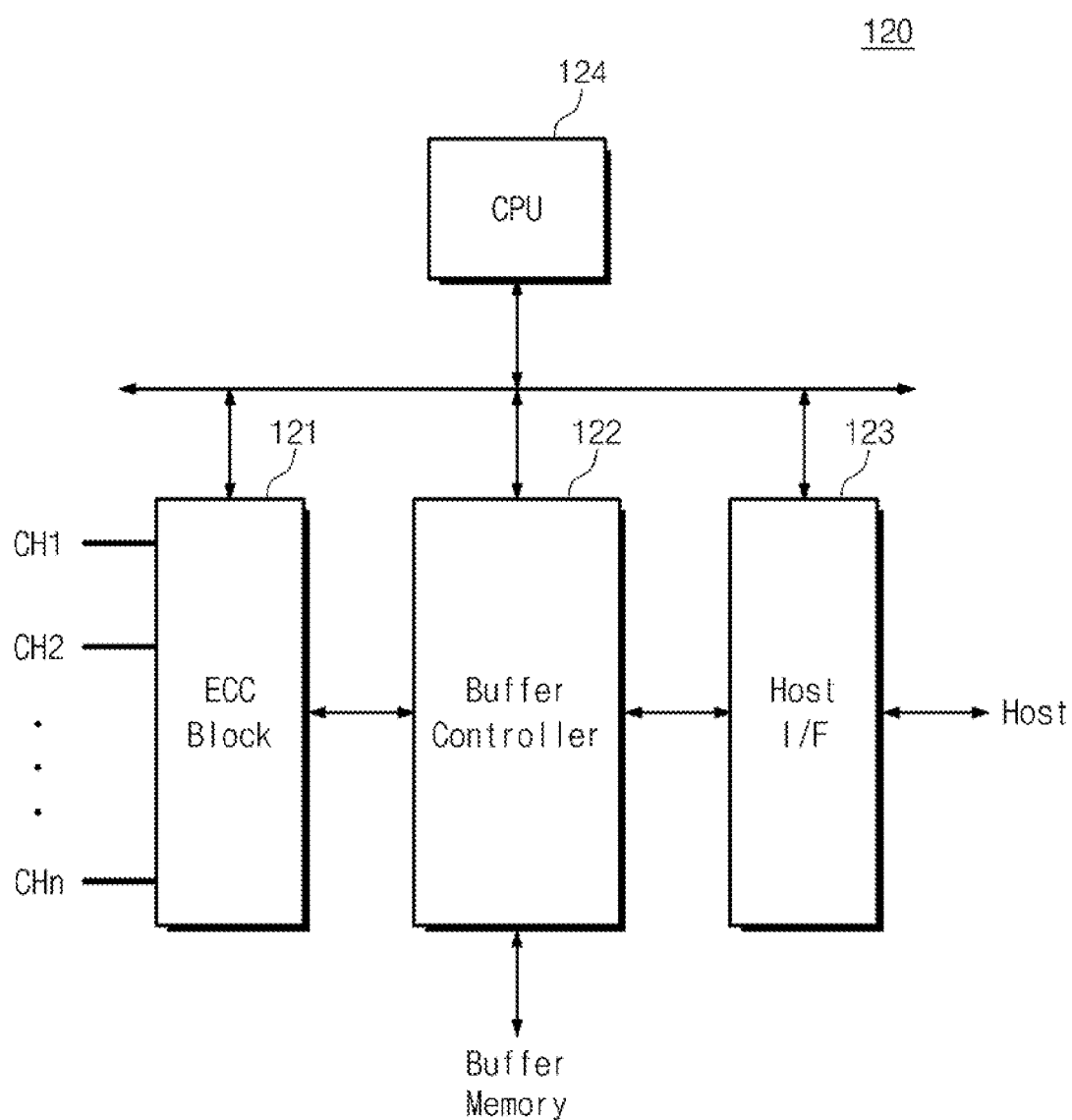
FIG. 2 is a block diagram illustrating a storage controller of FIG. 1 according to an exemplary embodiment of the inventive concept.

FIG. 2 is a block diagram illustrating a storage controller 120 of FIG. 1 according to an exemplary embodiment of the inventive concept. Referring to FIG. 2, a storage controller 120 may include the ECC block 121, a buffer controller 122, a host interface (I/F) 123, and a central processing unit (CPU) 124.

The ECC block 121 may perform error detecting and correcting operations for data provided from memory devices 111 to 114 of FIG. 1 under the control of the CPU 124. The ECC block 121 may determine a syndrome S of data on each channel. The ECC block 121 may obtain an error location polynomial of data on each channel and a root of the error location polynomial, based upon the determined syndrome S. The ECC block 121 may include a syndrome determination block, a KES block, and a Chien search block.

In particular, the KES block or the Chien search block may be independent of channels CH1 to CHn. The KES block may obtain an error location polynomial of read data on any channel, based upon the syndrome obtained from each channel. The Chien search block may obtain a root of an error location polynomial for at least one channel of data transferred from the KES block. Data output as a result of an error correcting operation may be output by a channel unit.

Herein, the ECC block 121 can include a flash interface (not shown), which provides an interface between the storage medium 110 and the storage controller 120.

The buffer controller 122 may control read and write operations of a buffer memory (not shown). For example, the buffer controller 122 may temporarily store write data or read data in the buffer memory. The buffer memory may be formed of a volatile memory such as a synchronous DRAM (dynamic RAM) of appropriate capacity. Error correction may include the deteimination of a correction vector given read data for correcting an error of the read data. The buffer memory can be provided for the correction operation.

The host interface 123 may provide a physical interconnection between a host (not shown) and a storage device 100. That is, the host interface 123 may provide an interface with the storage device 100 capable of converting or translating a bus format of the host. The bus format of the host may include a USB (Universal Serial Bus), an SCSI (Small Computer System Interface), a PCI express (PCI-E), an ATA, a PATA (Parallel ATA), a SATA (Serial ATA), a SAS (Serial Attached SCSI), and the like. Further, the host interface 123 may support a disk emulation function that enables a host to recognize the storage device 100 as a hard disk drive (HDD).

The CPU 124 may be configured to decode a command CMD transferred from the host. The CPU 124 may control the ECC block 121, the buffer controller 122, and the host interface 123 to perform an operation corresponding to the command CMD. The CPU 124 may control the ECC block 121, the buffer controller 122, and the host interface 123 using values of control registers (not shown) within the host interface 123. The CPU 124 may control constituent elements according to firmware for driving the storage device 100.

The ECC block 121 may include a KES block and/or a Chien search block, which are independent of each channel. More particularly, processing elements of the KES block or the Chien search block may be set up such that the KES block and/or the Chien search block may be driven independently from the channels. Accordingly, it is possible to drive the KES block or the Chien search block with few processing elements. The processing elements may include XOR gates, AND gates, etc., depending on an architecture. Further, the KES block or the Chien search block may be driven independently without a large number of gates. A number of gates, or the gate count, may be increased to improve the performance of processing elements. The storage controller 120 may perform an error correcting operation at a high speed and uses a chip area efficiently. Further, a magnitude of a peak current (power consumption) may be reduced as compared with the case that an error correcting operation is performed in parallel with respect to the channels.

Figure 3:
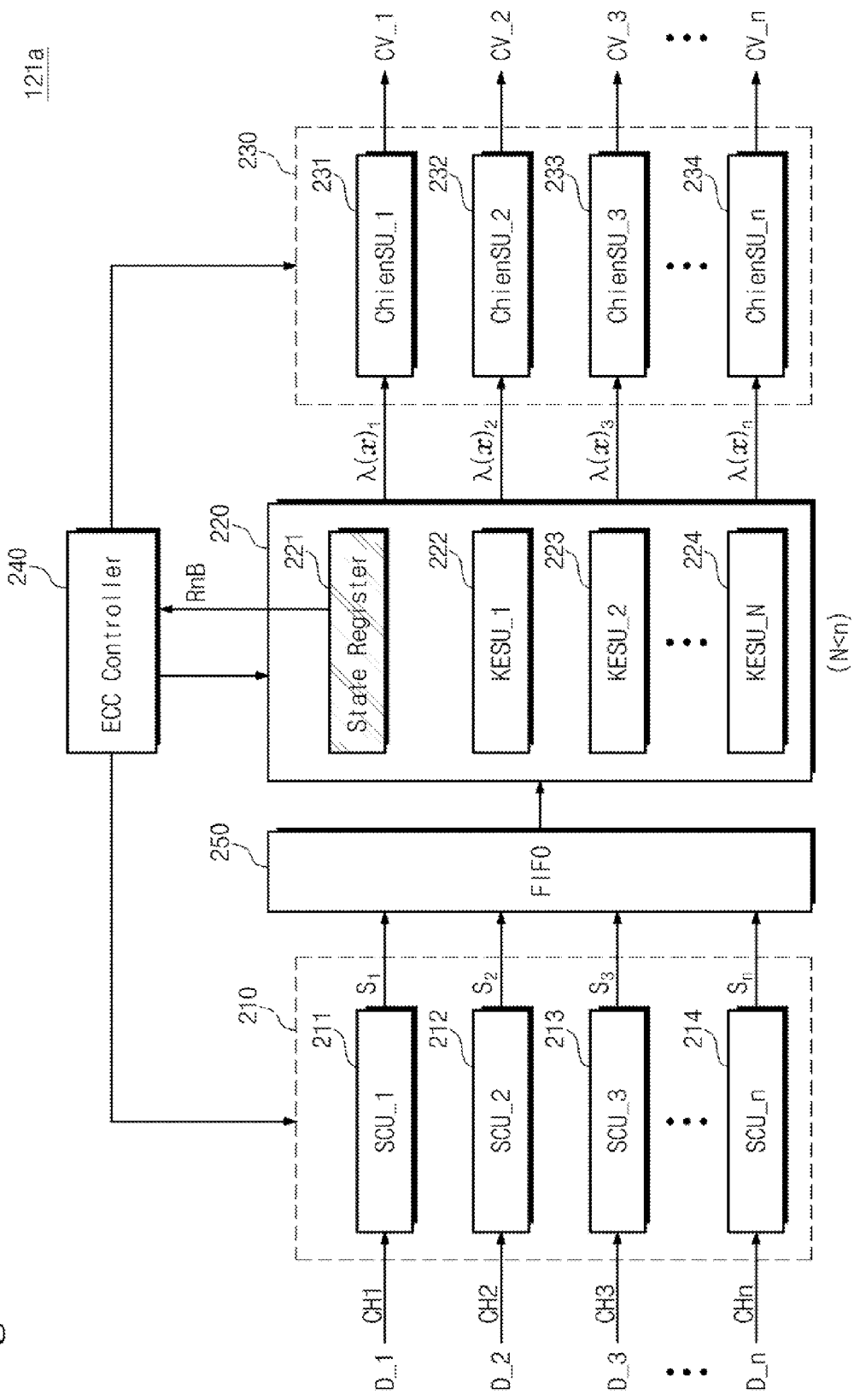
FIG. 3 is a block diagram illustrating an ECC block of FIG. 2 according to an exemplary embodiment of the inventive concept.

FIG. 3 is a block diagram illustrating an ECC block of FIG. 2 according to an exemplary embodiment of the inventive concept. Referring to FIG. 3, the ECC block 121a may include a syndrome determination block 210, a KES block 220, a Chien search block 230, an ECC controller 240, and a first-in first-out (FIFO) buffer 250.

The syndrome determination block 210 may include a plurality of syndrome determining units (represented by SCU_1 to SCU_n of FIG. 3) 211 to 214. Each of the syndrome determining units 211 to 214 may determine a syndrome of data transferred via a corresponding channel. For example, the syndrome determining unit 211 may determine a syndrome of data D_1 transferred via a corresponding channel CH1, and the syndrome determining unit 214 may determine a syndrome of data D_n transferred via a corresponding channel CHn. Herein, data D_1 to D_n transferred via channels CH1 to CHn may be called channel data.

The syndrome determining unit (SCU_1) 211 may determine a syndrome of channel data D_1 transferred via a first channel CH1. The syndrome determining unit (SCU_2) 212 may determine a syndrome of channel data D_2 transferred via a second channel CH2. The syndrome determining unit (SCU_3) 213 may determine a syndrome of channel data D_3 transferred via a third channel CH3. As described above, each of the syndrome determining units 211 to 214 may determine a syndrome of channel data transferred via a corresponding channel. Herein, each of the syndrome determining units 211 to 214 may be formed of one processing element.

Syndromes S1 to Sn of channel data D_1 to D_n determined by the syndrome determination block 210 may be provided to the FIFO buffer 250. The syndromes S1 to Sn may be transferred to the KES block 220 according to an input order.

The KES block 220 may obtain error location polynomials based upon the syndromes S1 to Sn provided from the syndrome determining units 211 to 214. The KES block 220 may be implemented by an Euclidean method, a Modified Euclidean (ME) method, or a Berlecamp-Massay (BM) method.

The KES block 220 may include a state register 221 and a plurality of KES units (represented by KESU_1 to KESU_N) 222 to 224. The state register 221 may store driving states of the plurality of KES units 222 to 224. The state register 221 may provide the driving states of the plurality of KES units 222 to 224 to the ECC controller 240 in real time. For example, among the plurality of KES units 222 to 224, one currently determining an error location polynomial (ELP) may set an RnB bit of the state register 221 to a busy state (or, logically '0'). Channel information of channel data being currently determined by each of the plurality of KES units 222 to 224 may be stored in the state register 221. That is, the channel information may be used to indicate whether channel data being currently determined by a KES unit having a busy state corresponds to any channel. RnB bits of the state register 221 corresponding to unused KES units of the plurality of KES units 222 to 224 may be set to a ready state (or, logically '1'). No channel information of the unused KES units may be stored in the state register 221.

If data determined to be erroneous among the syndromes S1 to Sn stored in the FIFO buffer 250 is provided, the ECC controller 240 may select one of the plurality of KES units 222 to 224 based upon RnB bits of the state register 221. The selected KES unit KESU_x may obtain an error location polynomial of the erroneous data. An RnB bit corresponding to the selected KES unit KESU_x may be switched to a busy state. The state register 221 may be updated with channel information indicating whether channel data for obtaining the error location polynomial corresponds to any channel, together with the RnB bit switched to the busy state.

According to the above-described method, the number of KES units of the KES block 220 may be less than that of channels CH1 to CHn. Each of the KES units 222 to 224 may be used to obtain error location polynomials of various channel data as occasion demands, not fixed to any one channel. That is, the KES units 222 to 224 may be driven independently from each channel.

If the above-described KES block 220 is used, it is possible to solve a waiting problem caused when channel data determined to be normal is synchronized with error correction operations of remaining channels. That is, an operation of obtaining an error location polynomial may be carried out with respect to a channel where an error exists. The number of erroneous bits of respective channel data may be different. In this case, the number of clock cycles needed for a KES determination may be different according to the number of erroneous bits. A driving efficiency may be improved by performing a KES determination independent of the channels.

The Chien search block 230 may determine roots of error location polynomials $\lambda(x)1$ to $\lambda(x)n$. The Chien search block 230 may include a plurality of Chien search units (represented by ChienSU_1 to ChienSU_n of FIG. 3) 231 to 234 corresponding to channels CH1 to CHn, respectively. The Chien search units 231 to 234 may obtain roots of error location polynomials, corresponding to channels CH1 to CHn, provided from the KES block 220. The Chien search unit 231 may deteiniine a root of an error location polynomial of channel data D_1 corresponding to a first channel CH1. The Chien search unit 232 may determine a root of an error location polynomial of channel data D_2 corresponding to a second channel CH2. The Chien search unit 233 may determine a root of an error location polynomial of channel data D_3 corresponding to a third channel CH3. The Chien search units 231 to 234 may output correction vectors CV_1 to CV_n for correcting errors by obtaining roots of error location polynomials of channel data CH1 to CHn.

The ECC controller 240 may control the syndrome determination block 210, the KES block 220, and the Chien search block 230 so as to perforin error detecting and correcting operations of channel data D_1 to D_n provided to channels CH1 to CHn from a storage medium 110 of FIG. 1. The ECC controller 240 may refer to driving states of the KES units 222 to 224 updated at the state register 221 to assign KES operations of the channel data D_1 to D_n to the KES units 222 to 224. Channel data whose syndrome value is a zero vector may be excluded from a KES operation.

Herein, each of the syndrome determining units 211 to 214, the KES units 222 to 224, and the Chien search units 231 to 234 may be formed of one processing element. The KES units 222 to 224 may obtain an error location polynomial with respect to channel data where an error exists. Accordingly, the driving efficiency may be improved, so that a driving cycle of each KES unit is reduced. According to an exemplary embodiment of the inventive concept, while a driving cycle is halved, a number of KES units may be increased by about 1.1 to 1.5 times.

Figure 4:
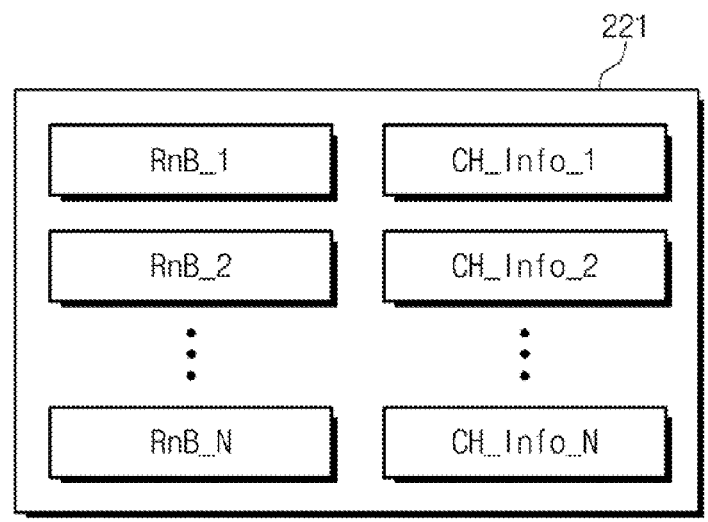
FIG. 4 is a diagram showing a state register of FIG. 3.

FIG. 4 is a diagram showing a state register of FIG. 3. Referring to FIG. 4, a state register 221 may store RnB bits RnB_1 to RnB_N and channel information CH_Info_1 to CH_Info_N, which correspond to a plurality of KES units 222 to 224 of FIG. 3, respectively.

If a KES unit 222 is in use to determine an error location polynomial, an RnB bit RnB_1 may be set to a busy state. Channel information CH_Info_1 of channel data assigned to the KES unit 222 may be updated. For example, if the KES unit 222 is set to obtain an error location polynomial of the channel data of a second channel CH2, an RnB bit RnB_1 may be set to a busy state, and channel information CH_Info_1 corresponding to the RnB bit RnB_1 may be stored to indicate the second channel CH2.

If the KES unit 222 ends an operation of obtaining an error location polynomial and waits for next determination, the RnB bit RnB_1 may be set to a ready state. Further, channel information CH_Info_1 corresponding to the RnB bit RnB_1 may be reset. An operation of setting the state register 221 may be applied to remaining RnB bits RnB_2 to RnB_N and channel information CH_Info_2 to CH_Info_N in the same manner as described with reference to the KES unit 222.

Figure 5:
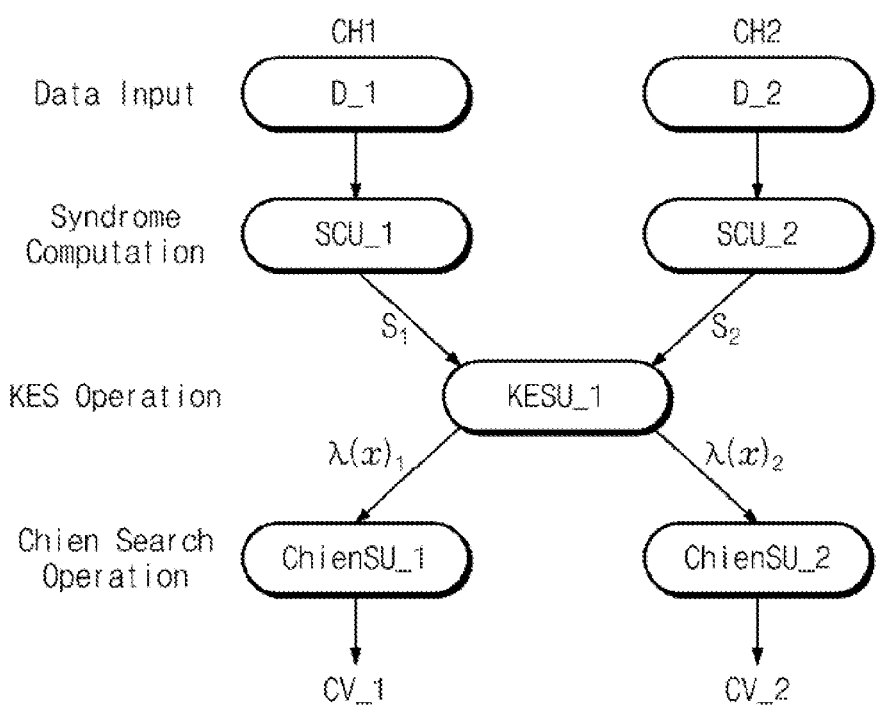
FIG. 5 is a diagram for describing an operation of an ECC block according to an exemplary embodiment of the inventive concept.

FIG. 5 is a diagram for describing an operation of an ECC block according to an exemplary embodiment of the inventive concept. As illustrated in FIG. 5, it may be assumed that read data is provided from a storage medium 110 via two channels.

First channel data D_1 and second channel data D_2 may be provided to an ECC block 121a from the storage medium 110 via a first channel CH1 and a second channel CH2, respectively. Syndrome determining units SCU_1 and SCU_2 may determine syndromes of the first and second channel data D_1 and D_2, respectively. The syndromes S1 and S2 determined by the syndrome determining units SCU_1 and SCU_2 may be temporarily stored in a FIFO buffer 250. The syndromes S1 and S2 of the first and second channel data D_1 and D_2 stored in the FIFO buffer 250 may be transferred to a KES block 220.

The KES block 220 may include one or more KES units. For convenience of explanation, it may be assumed that the KES block 220 includes one KES unit KESU_1. The KES unit KESU_1 may determine an error location polynomial of any one of the syndromes S1 and S2 according to a state regardless of channel. The KES unit KESU_1 may determine an error location polynomial in few clock cycles. The KES unit KESU_1 may provide Chien search units 231 and 232 with error location polynomials $\lambda(x)1$ and $\lambda(x)2$ of the first and second channel data D_1 and D_2. Erroneous bits included in the first and second channel data D_1 and D_2 may be different in number. Since a clock cycle number needed for a KES determination is different according to the number of erroneous bits, the driving efficiency may be improved by performing the KES determination independently from the channels.

The Chien search units 231 and 232 may obtain roots of error location polynomials $\lambda(x)1$ and $\lambda(x)2$ of the first and second channel data and output correction vectors CV_1 and CV_2 corresponding to the obtained values, respectively.

With the above-described error correction sequence, the KES determination may be excluded or skipped with respect to channel data where no error exists. Accordingly, in case of the ECC block according to an exemplary embodiment of the inventive concept, a peak current and a consumed power may be reduced by reducing the number of unnecessary determinations.

Figure 6:
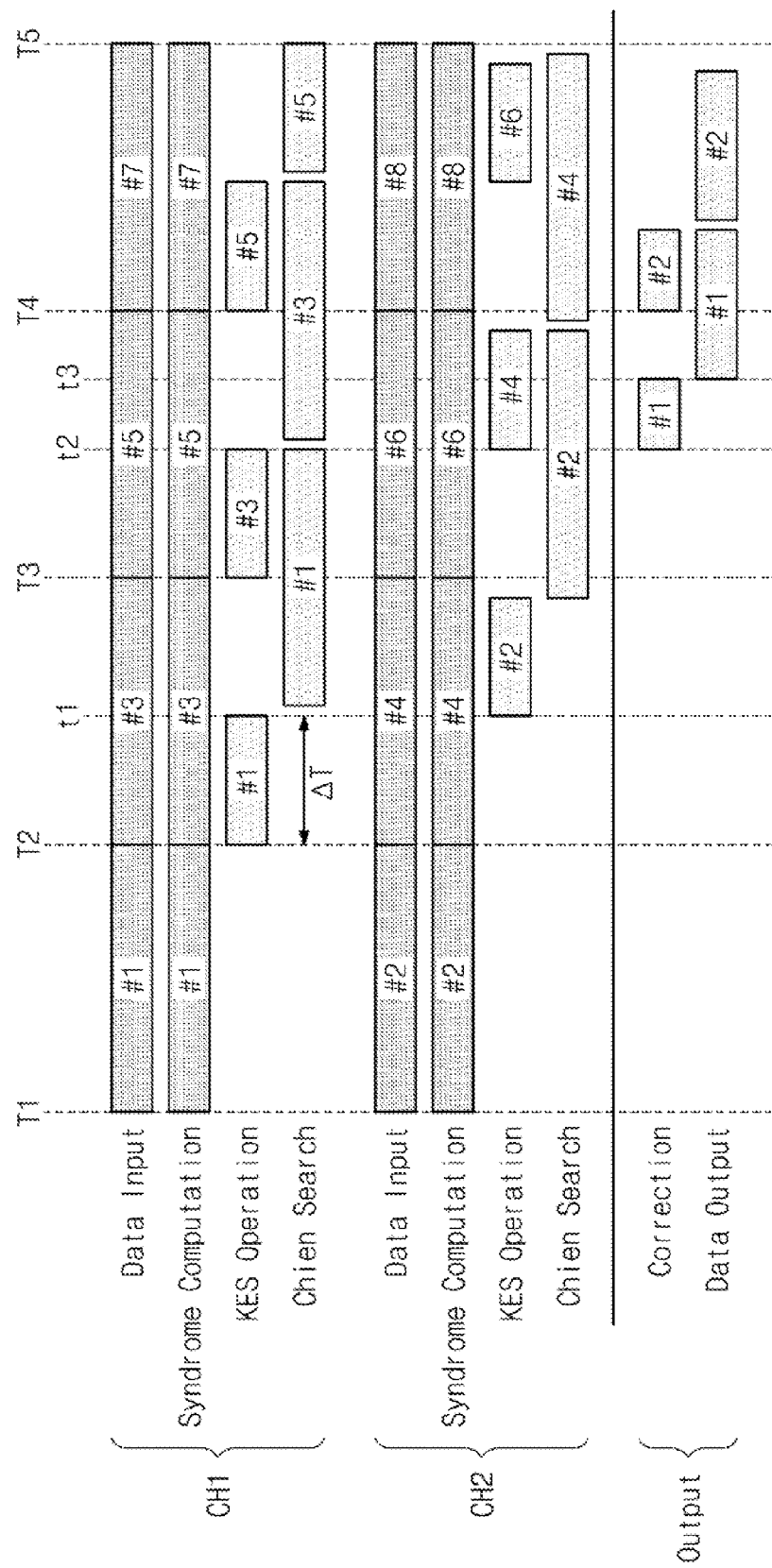
FIG. 6 is a timing diagram for describing an operation of an ECC block according to an exemplary embodiment of the inventive concept.

FIG. 6 is a timing diagram for describing an operation of an ECC block according to an exemplary embodiment of the inventive concept. Referring to FIG. 6, channel data #1 and #2 may be transferred to an ECC block 121 via a first channel CH1 and a second channel CH2 from a time T1. If the channel data #1 and #2 are transferred to the ECC block 121 via the first and second channels CH1 and CH2 from a time T1, syndrome determining units SCU1 and SCU_2 of FIG. 5 may determine syndromes in real time. A delay corresponding to a predetermined clock cycle may exist between an input of data and a determination of a syndrome. For convenience of explanation, the delay may be ignored.

If an input of the channel data #1 and #2 via corresponding channels and a syndrome determined by the syndrome determining units SCU_1 and SCU_2 are completed, a KES block 220 may perform a KES operation to obtain error location polynomials. The KES block 220 may include one or more processing elements, which are configured to perform the KES operation for obtaining error location polynomials during few clock cycles. Herein, for convenience of explanation, it may be assumed that the KES block 220 includes a KES unit formed of one processing element. However, a gate count of one or more processing elements included in the KES block 220 may be increased for a high-speed operation.

A KES operation may commence from a time T2 to obtain an error location polynomial based upon a syndrome of the channel data #1. The KES operation of the channel data #1 may be ended at a time t1. A KES unit included in the KES block 220 may be set to a ready state until a time T2. The KES unit may be set to a busy state during an interval from T2 to t1. During the interval from T2 to t1, the KES operation of the channel data #1 may be carried out. If a state of the KES unit is switched to a ready state at a time t1, the KES unit may be assigned to process the channel data #2. A Chien search operation of the Chien search unit 231 of the channel data #1 may commence at a time t1.

At a time 2 when the Chien search operation of the channel data #1 is ended, an error of the channel data #1 may be corrected. Error-corrected channel data #1 may be output to an external device from a time t3. Here, an initial latency may be reduced as compared with the case where a KES block is not independent of the channels.

A time taken to perform an error correcting operation of data input to the ECC block 121 may be dependent on a total latency generated by respective steps. That is, a total latency of an error correcting operation may correspond to a time taken to perform a syndrome determination, a KES operation, a Chien search operation, and error correction. The performance of the ECC block 121 may be strongly associated with a reduction of the total latency. The efficiency of operation may be maximized by configuring the KES block 220 independently from the channels and using a ready/busy signal.

The performance of the KES block 220 may be improved by shortening a time taken to correct an error. That is, a data output time may be shortened by reducing a time taken to perform a KES operation.

Figure 7:
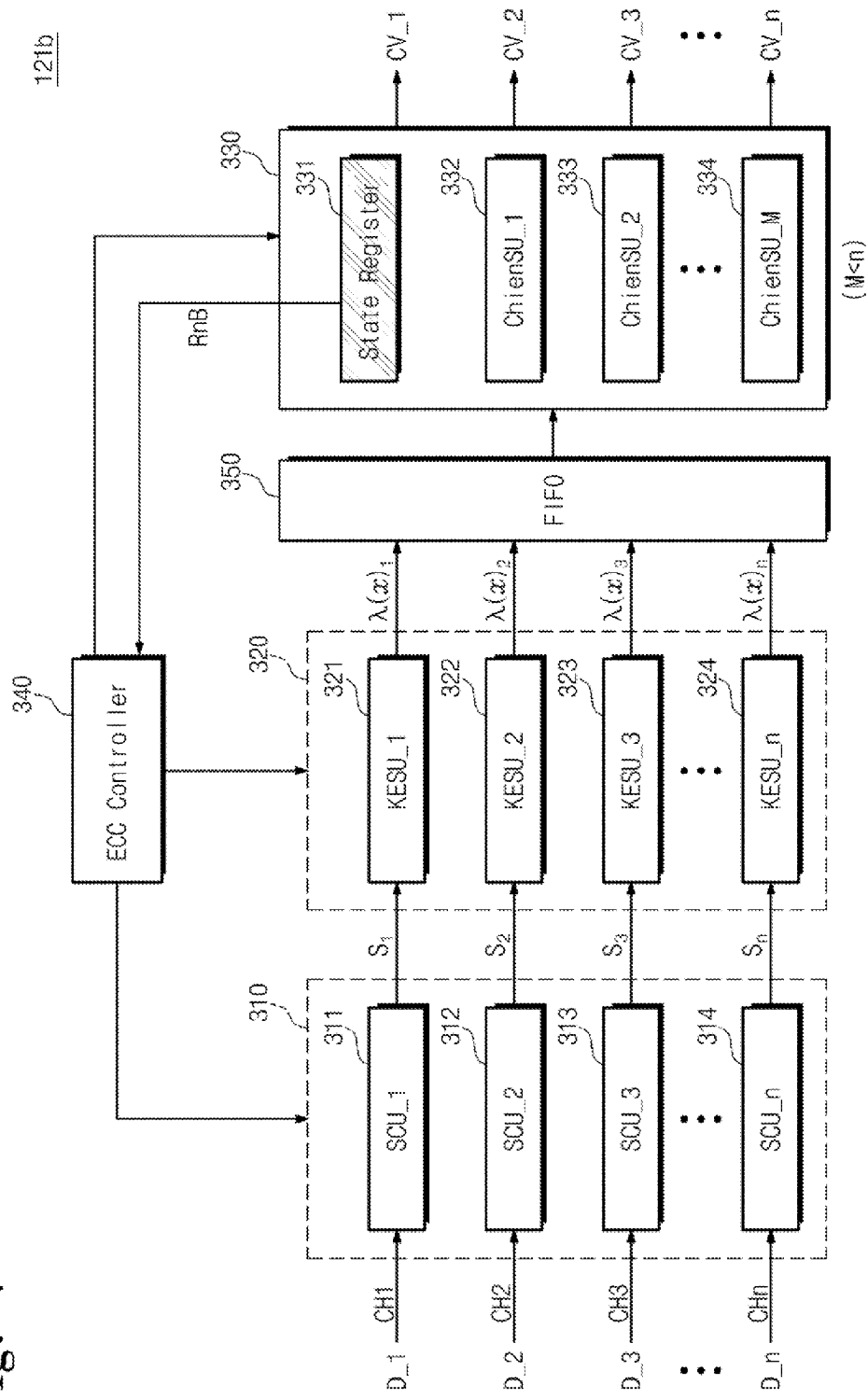
FIG. 7 is a block diagram illustrating an ECC block of FIG. 2 according to an exemplary embodiment of the inventive concept.

FIG. 7 is a block diagram illustrating an ECC block of FIG. 2 according to an exemplary embodiment of the inventive concept. Referring to FIG. 7, the ECC block 121b may include a syndrome determination block 310, a KES block 320, a Chien search block 330, an ECC controller 340, and a first-in first-out (FIFO) buffer 350.

The syndrome determination block 310 may include a plurality of syndrome determining units (represented by SCU_1 to SCU_n of FIG. 7) 311 to 314. Each of the syndrome determining units 311 to 314 may determine a syndrome of data transferred via a corresponding channel. The syndrome determining unit (SCU_1) 311 may determine a syndrome of channel data D_1 transferred via a first channel CH1. The syndrome determining unit (SCU_2) 312 may determine a syndrome of channel data D_2 transferred via a second channel CH2. The syndrome determining unit (SCU_3) 313 may determine a syndrome of channel data D_3 transferred via a third channel CH3. As described above, each of the syndrome determining units 311 to 314 may determine a syndrome of channel data transferred via a corresponding channel. Herein, each of the syndrome determining units 311 to 314 may be formed of one processing element.

The KES block 320 may obtain error location polynomials based upon the syndromes S1 to Sn provided from the syndrome determining units 311 to 314. The KES block 320 may be implemented by an Euclidean method, a Modified Euclidean (ME) method, or a Berlecamp-Massay (BM) method.

The KES block 320 may include a plurality of KES units (represented by KESU_1 to KESU_N) 321 to 324. The KES units 321 to 324 may obtain error location polynomials $\lambda(x)1$ to $\lambda(x)n$ based upon the syndromes S1 to Sn from the syndrome determining units 311 to 314. The error location polynomials $\lambda(x)1$ to $\lambda(x)n$ generated by the KES units 321 to 324 may be transferred to the FIFO buffer 350 under the control of the ECC controller 340. The error location polynomials $\lambda(x)1$ to $\lambda(x)n$ of channel data stored in the FIFO buffer 350 may be transferred to the Chien search block 330 in an input order.

The Chien search block 330 may determine roots of the error location polynomials. The Chien search block 330 may include a state register 331 and a plurality of Chien search units (represented by ChienSU_1 to ChienSU_M of FIG. 7) 332 to 334. The state register 321 may store driving states of the Chien search units 332 to 334. The state register 331 may provide driving states of the Chien search units 332 to 334 to the ECC controller 340 in real time. For example, among the Chien search units 332 to 334, one currently performing a Chien search operation may set an RnB bit of the state register 331 to a busy state (or, logically '0').

Channel information of channel data being currently determined by each of the Chien search units 332 to 334 may be stored in the state register 221. That is, the channel information may be used to indicate whether channel data being currently determined by a Chien search unit of a busy state corresponds to any channel. RnB bits of the state register 221 corresponding to unused Chien search units of the Chien search units 332 to 334 may be set to a ready state (or, logically '1'). No channel information of the unused Chien search units may be stored in the state register 331.

The Chien search units 332 to 334 may determine roots of error location polynomials $\lambda(x)1$ to $\lambda(x)n$ each corresponding to channel data provided from the FIFO buffer 350. The ECC controller 340 may assign the error location polynomials $\lambda(x)1$ to $\lambda(x)n$ to the Chien search units 332 to 334 based upon the RnB bits and channel information of the state register 331. The RnB bits of the state register 331 may be maintained at a ready state before an error location unit is assigned to a Chien search unit. When Chien search units are assigned to determine error location polynomials, RnB bits of the state register 331 may be switched to a busy state and channel information corresponding to switched bits may be updated. If a root of an error location polynomial is obtained by an assigned Chien search unit, an RnB bit of the assigned Chien search unit may be switched to a ready state and channel information corresponding to the assigned Chien search unit may be reset.

According to the above-described method, the number of Chien search units 331 to 334 of the Chien search block 330 may be less than the number of channels.

Each of the Chien search units 331 to 334 may be used to obtain roots of error location polynomials of various channel data as occasion demands, not fixed to any one channel. The number of clock cycles needed by a Chien search operation may vary according to error location. When the number of erroneous bits on different channels vary, efficiency may be improved by configuring the Chien search units 331 to 334 to be independent of the channels.

The ECC controller 340 may control the syndrome determination block 310, the KES block 320, and the Chien search block 330 so as to perform error detecting and correcting operations of channel data provided from a storage medium 110 of FIG. 1. The ECC controller 240 may refer to driving states of the Chien search units 332 to 334 updated at the state register 331 to assign error location polynomials corresponding to channels to the Chien search units 332 to 334.

Herein, each of the syndrome determining units 311 to 314, the KES units 321 to 324, and the Chien search units 332 to 334 may be formed of one processing element. According to an exemplary embodiment of the inventive concept, while a driving cycle is halved, a number of Chien search units may be increased by about 1.8 to 1.9 times.

Figure 8:
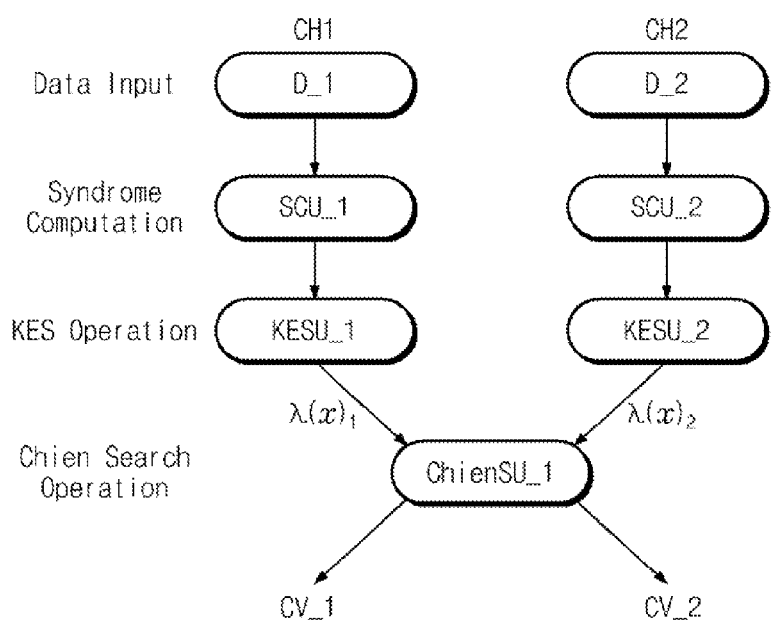
FIG. 8 is a diagram for describing an operation of an ECC block according to an exemplary embodiment of the inventive concept.

FIG. 8 is a diagram for describing an operation of an ECC block according to an exemplary embodiment of the inventive concept. As illustrated in FIG. 8, it may be assumed that read data is provided from a storage medium 110 via two channels.

First channel data D_1 and second channel data D_2 may be provided to an ECC block 121b from the storage medium 110 via a first channel CH1 and a second channel CH2, respectively. First of all, syndrome determining units SCU_1 and SCU_2 may determine syndromes of the first and second channel data D_1 and D_2, respectively. The syndromes S1 and S2 determined by the syndrome determining units SCU_1 and SCU_2 may be transferred to KES units 321 and 322, respectively.

The KES units 321 and 322 may obtain error location polynomials of the syndromes S1 and S2. The KES units 321 and 322 may generate error location polynomials $\lambda(x)1$ and $\lambda(x)2$ of the first and second channel data D_1 and D_2 to send them to a FIFO buffer 350. The error location polynomials $\lambda(x)1$ and $\lambda(x)2$ temporarily stored in the FIFO buffer 350 may be provided to a Chien search block 330 sequentially.

The Chien search block 330 may include one or more Chien search units. The Chien search units may obtain a root of an error location polynomial of one of the error location polynomials $\lambda(x)1$ and $\lambda(x)2$ according to their states. That is, it is possible to obtain a root of an error location polynomial in few clock cycles. The Chien search block 330 may generate correction vectors CV_1 and CV_2 corresponding to channels CH1 and CH2 by obtaining roots of the error location polynomials $\lambda(x)1$ and $\lambda(x)2$ of the channel data.

Figure 9:
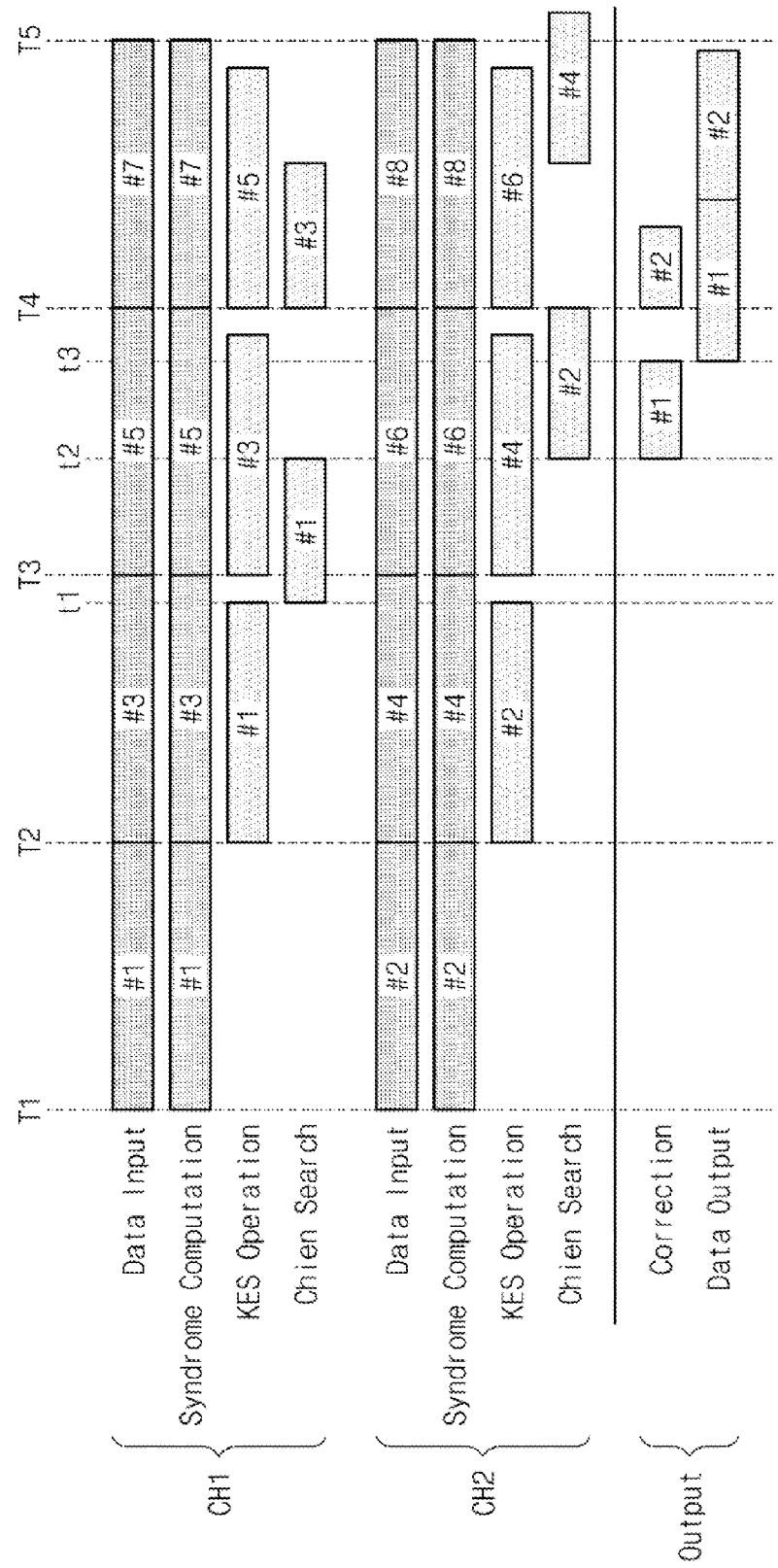
FIG. 9 is a timing diagram for describing an operation of an ECC block according to an exemplary embodiment of the inventive concept.

FIG. 9 is a timing diagram for describing an operation of an ECC block according to an exemplary embodiment of the inventive concept. Referring to FIG. 9, channel data #1 and #2 may be transferred to an ECC block 121b via a first channel CH1 and a second channel CH2 from a time T1.

If the channel data #1 and #2 are transferred to the ECC block 121b via the first and second channels CH1 and CH2 from a time T1, syndrome determining units SCU™ and SCU_2 of FIG. 8 may determine syndromes in real time. A delay corresponding to predetermined clock cycles may exist between an input of data and a determination of a syndrome. For convenience of explanation, the delay may be ignored.

If an input of the channel data #1 and #2 via corresponding channels and a syndrome determined by the syndrome determining units SCU_1 and SCU_2 are completed, KES units 321 and 322 may perform KES operations to obtain error location polynomials, respectively. The KES operations may commence from a time T2 to obtain error location polynomials based upon syndromes of the channel data #1 and #2. The KES operations of the channel data #1 and #2 may be carried out in parallel. The KES operations of the channel data #1 and #2 may be ended at a time t1. Following a completion of the KES operations, a Chien search operation of an error location polynomial of the first channel data #1 generated by the KES operation may commence at a time t1.

Herein, it may be assumed that the Chien search block 330 is foi Hied of a processing element. Accordingly, the Chien search operation may be performed with respect to the channel data #1 at the time t1. At a time t2 when the Chien search operation of the channel data #1 is ended, the Chien search operation of the channel data #2 may be performed. Until a time T2, a Chien search unit in the Chien search block 330 may have a ready state. The Chien search unit may be set to a busy state during an interval from T2 to t1. During the interval from T2 to t1, the Chien search operation of the channel data #1 may be carried out. If a state of the Chien search unit is switched to a ready state at a time t1, a Chien search operation of the channel data #2 may commence. An error of the channel data #1 may be corrected from a time t2 based upon a correction vector CV_1 generated by the Chien search operation. Error-corrected channel data #1 may be output to an external device from a time t3.

The Chien search block 330 may include one or more processing elements, which are configured to perform a Chien search operation during few clock cycles. For convenience of explanation, the ECC block 121b is described under the assumption that the Chien search block 330 includes a Chien search unit formed of one processing element. However, one or more processing elements included in the Chien search block 330 may have a gate count increased for a high-speed operation.

Error-corrected channel data #1 may be output to an external device from a time t3. Here, an initial latency is reduced as compared with a case where a Chien search block is not independent of the channels.

Figure 10:
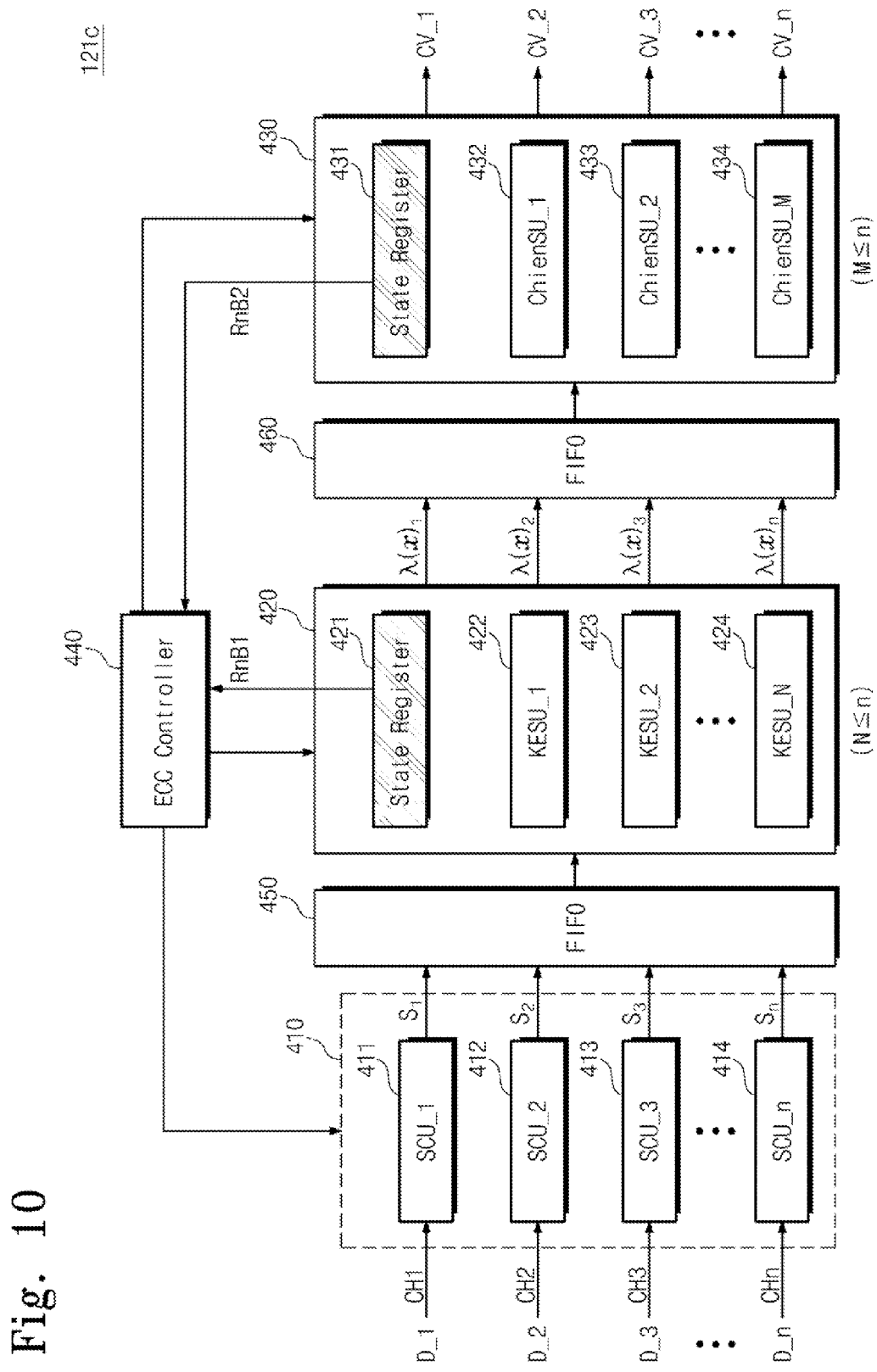
FIG. 10 is a block diagram illustrating an ECC block of FIG. 2 according to an exemplary embodiment of the inventive concept.

FIG. 10 is a block diagram illustrating an ECC block of FIG. 2 according to an exemplary embodiment of the inventive concept. Referring to FIG. 10, the ECC block 121c may include a syndrome determination block 410, a KES block 420, a Chien search block 430, an ECC controller 440, and first-in first-out (FIFO) buffers 450 and 460.

The syndrome determination block 410 may include a plurality of syndrome determining units (represented by SCU_1 to SCU_n of FIG. 3) 411 to 414. Each of the syndrome determining units 411 to 414 may determine a syndrome of data transferred via a corresponding channel.

The syndrome determining unit (SCU_1) 411 may determine a syndrome of channel data D_1 transferred via a first channel CH1. The syndrome determining unit (SCU_2) 412 may determine a syndrome of channel data D_2 transferred via a second channel CH2. The syndrome determining unit (SCU_3) 413 may determine a syndrome of channel data D_3 transferred via a third channel CH3. As described above, each of the syndrome determining units 411 to 414 may determine a syndrome of channel data transferred via a corresponding channel. Herein, each of the syndrome determining units 411 to 414 may be formed of one processing element.

The syndromes S1 to Sn of the channel data D_1 to D_n determined by the syndrome determination block 410 may be transferred to the FIFO buffer 450. The syndromes S1 to Sn stored in the FIFO buffer 450 may be transferred to the KES block 420 in an input order.

The KES block 420 may obtain error location polynomials based upon the syndromes 51 to Sn. The KES block 420 may employ an Euclidean method, a Modified Euclidean (ME) method, or a Berlecamp-Massay (BM) method.

The KES block 420 may include a state register 421 and a plurality of KES units (represented by KESU_1 to KESU_N) 422 to 424. The state register 421 may store driving states (e.g., RnB bits and channel information) of the plurality of KES units 422 to 424. The state register 421 may provide driving states of the plurality of KES units 422 to 424 to the ECC controller 440 in real time.

For example, among the plurality of KES units 422 to 424, an RnB bit of the state register 421 corresponding to a KES unit currently determining an error location polynomial may set to a busy state (or, logically '0'). Channel information of channel data being currently determined by each of the plurality of KES units 422 to 424 may be stored in the state register 421. RnB bits of the state register 421 corresponding to unused KES units of the plurality of KES units 422 to 424 may be set to a ready state (or, logically '1'), and channel information of the unused KES units may be set to a reset state.

If channel data determined to be erroneous among the syndromes S1 to Sn is provided, the ECC controller 440 may select one of the plurality of KES units 422 to 424 based upon RnB bits of the state register 421. The selected KES unit KESU_x may obtain an error location polynomial of the erroneous data. An RnB bit corresponding to the selected KES unit KESU_xmay be switched to a busy state. According to the above-described method, the number of KES units of the KES block 420 may be less than that of channels CH1 to CHn. Each of the KES units 422 to 424 may be used to obtain error location polynomials of various channel data as occasion demands, not fixed to any one channel.

If the above-described KES block 420 is used, it is possible to solve a waiting problem caused when channel data determined to be normal is synchronized with error correction operations of remaining channels. That is, an operation of obtaining an error location polynomial may be carried out with respect to a channel where an error exists. The number of erroneous bits of respective channel data may be different. In this case, the number of clock cycles needed for a KES determination may be different according to the number of erroneous bits. A driving efficiency may be improved by performing a KES determination independent of the channels.

The error location polynomials $\lambda(x)1$ to $\lambda(x)n$ of the channel data D_1 to D_n generated by the KES block 420 may be transferred to the FIFO buffer 460. The error location polynomials $\lambda(x)1$ to $\lambda(x)n$ stored in the FIFO buffer 460 may be transferred to the Chien search block 430 in an input order.

The Chien search block 430 may determine roots of the error location polynomials. The Chien search block 430 may include a state register 431 and a plurality of Chien search units (represented by ChienSU_1 to ChienSU_M of FIG. 7) 432 to 434. The state register 431 may store driving states (e.g., RnB bits and channel information) of the Chien search units 432 to 434. The state register 431 may provide driving states of the Chien search units 432 to 434 to the ECC controller 440 in real time.

The Chien search units 432 to 434 may determine roots of error location polynomials λ(x)1 to λ(x)n each corresponding to channel data. The ECC controller 440 may assign error location polynomials λ(x)1 to λ(x)n to the Chien search units 432 to 434 based upon the RnB bits and channel information of the state register 431. The RnB bits of the state register 431 may be maintained at a ready state before an error location unit is assigned to a Chien search unit. When Chien search units are assigned to determine error location polynomials, RnB bits of the state register 431 may be switched to a busy state and channel information corresponding to switched bits may be set. If a root of an error location polynomial is obtained by an assigned Chien search unit, an RnB bit of the state register 431 corresponding to the assigned Chien search unit may be switched to a ready state and channel information corresponding to the assigned Chien search unit may be reset.

According to the above-described method, the number of Chien search units 432 to 434 of the Chien search block 430 may be less than the number of channels. Each of the Chien search units 432 to 434 may be used to obtain roots of error location polynomials of various channel data as occasion demands, not fixed to any one channel. The number of clock cycles needed by a Chien search operation may vary according to error location. When the number of erroneous bits on different channels vary, efficiency may be improved by configuring the Chien search units 432 to 434 to be independent of the channels.

The ECC controller 440 may control the syndrome determination block 410, the KES block 420, and the Chien search block 430 so as to perform error detecting and correcting operations of channel data provided from a storage medium 110 of FIG. 1. The ECC controller 440 may refer to updated ready/busy states of the state registers 421 and 431 to control the KES block 420 and the Chien search block 430. That is, when obtaining error location polynomials and roots of error location polynomials, the ECC controller 440 may assign processing operations with reference to the KES units 422 to 424 and the Chien search units 432 to 434.

Herein, each of the syndrome determining units 411 to 414, the KES units 422 to 424, and the Chien search units 432 to 434 may be formed of one processing element. According to an exemplary embodiment of the inventive concept, while a driving cycle is halved, a number of KES units may be increased by about 1.1 to 1.5 times, and a number of Chien search units may be increased by about 1.8 to 1.9 times.

Figure 11:
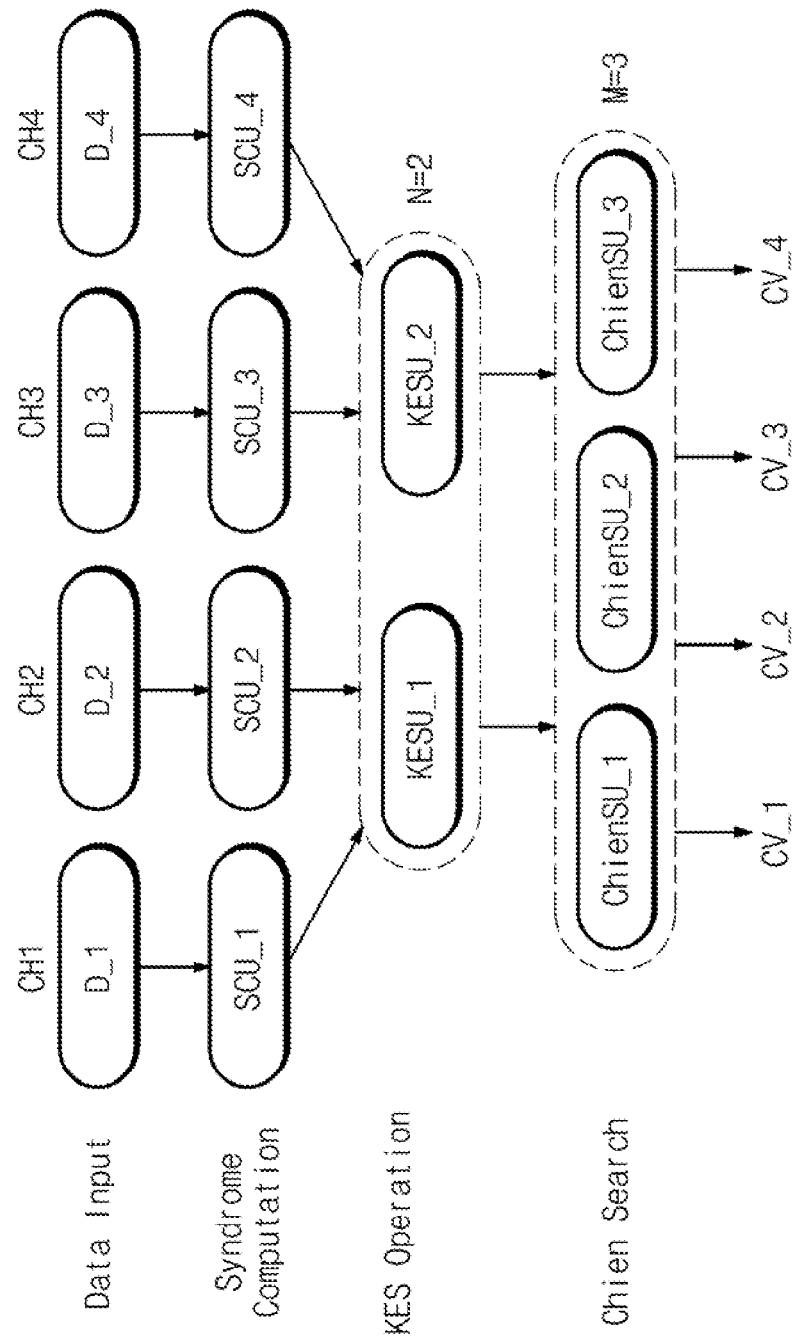
FIG. 11 is a diagram for describing an operation of an ECC block of FIG. 11.

FIG. 11 is a diagram for describing an operation of an ECC block of FIG. 11. As illustrated in FIG. 11, it may be assumed that channel data D_1 to D_4 are provided to a storage controller 120 of FIG. 1 from memory devices via four channels CH1 to CH4. Further, it may be assumed that a KES block 420 includes two KES units KESU_1 and KESU_2, and a Chien search block 430 includes three Chien search units ChienSU_1, ChienSU_2, and ChienSU_3. The ECC block will be more fully described under the above-described assumption.

The channel data D_1 to D_4 provided from a storage medium 110 of FIG. 1 may be input to an ECC block 121c. The channel data D_1 to D_4 may be transferred to corresponding channels CH1 to CH4, respectively. The channel data D_1 may be transferred to the ECC block 121c via a first channel CH1. The channel data D_2 may be transferred to the ECC block 121c via a second channel CH2. The channel data D_3 may be transferred to the ECC block 121c via a third channel CH3. The channel data D_4 may be transferred to the ECC block 121c via a fourth channel CH4.

Syndrome determining units SCU_1, SCU_2, SCU_4, and SCU_4 of a syndrome determination block 410 of FIG. 10 may be assigned to the channels CH1, CH2, CH3, and CH4, respectively. The syndrome determining unit SCU_1 may determine a syndrome of the channel data D_1 transferred via the first channel CH1. The syndrome determining unit SCU_2 may determine a syndrome of the channel data D_2 transferred via the second channel CH2. The syndrome determining unit SCU_3 may determine a syndrome of the channel data D_3 transferred via the third channel CH3. The syndrome determining unit SCU_4 may determine a syndrome of the channel data D_4 transferred via the fourth channel CH4.

The KES block 420 of FIG. 10 may determine error location polynomials based upon syndromes provided from syndrome determining units SCU_1 to SCU_4. The number of KES units KESU_1 and KESU_2 in the KES block 420 may be less than the number of the channels CH1 to CH4. Syndromes provided faun the syndrome determining units SCU_1 to SCU_4 may include a syndrome indicating that no error exists. In this case, it may be unnecessary to obtain an error location polynomial of channel data where no error exits. Accordingly, the KES units KESU_1 to KESU_2 may be configured to selectively determine an error location polynomial of channel data determined to be erroneous.

A KES operation of data including the less number of erroneous bits may be ended rapidly. In this case, a KES operation of other data may be rapidly assigned with reference to states of a state register 421 corresponding to the KES units KESU_1 to KESU_2. Accordingly, it may be possible to prevent any one of the KES units KESU_1 to KESU_2 from being maintained at an idle state. Error location polynomials λ(x)1 to λ(x)i (i being an integer less than 4) generated by the KES units KESU_1 to KESU_2 may be transferred to a Chien search block 430 of FIG. 10.

The Chien search block 430 may determine roots of error location polynomials λ(x)1 to λ(x)i. The Chien search block 430 may include three Chien search units ChienSU_1, ChienSU_2, and ChienSU_3. The error location polynomials λ(x)1 to λ(x)i may be assigned to the Chien search units ChienSU_1, ChienSU_2, and ChienSU_3 based upon values of the state register 431. If roots of the error location polynomials λ(x)1 to λ(x)i may be determined by the Chien search units ChienSU_1, ChienSU_2, and ChienSU_3, then correction vectors CV_1, CV_2, CV_3, and CV_4 of channel data D1, D_2, D_3, and D_4 may also be determined.

Figure 12A:
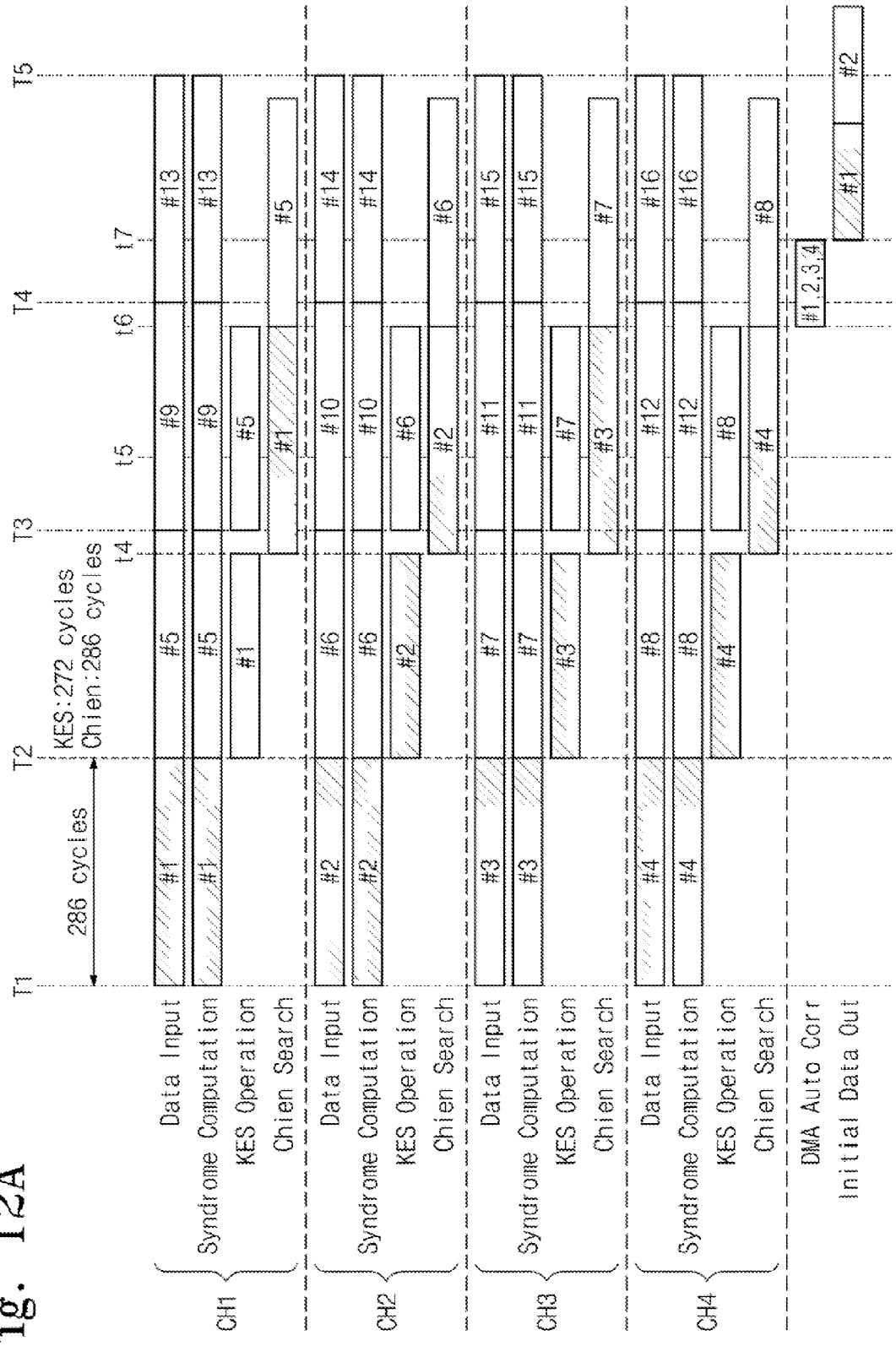
FIG. 12A is a timing diagram illustrating an error correcting operation when KES units and Chien search units are dependent on the channels.

FIG. 12A is a timing diagram illustrating an error correcting operation when KES units and Chien search units are dependent on the channels.

Referring to FIG. 12A, channel data #1, #2, #3, and #4 read from memory devices may be sent in parallel to an ECC block via four channels CH1, CH2, CH3, and CH4 from a time T1. At the same time, syndromes of the channel data #1, #2, #3, and #4 may be determined by syndrome determining units, respectively. An input of the channel data #1, #2, #3, and #4 and a syndrome determining operation may be ended at a time T2.

At the time T2, channel data #5, #6, #7, and #8 read from memory devices may be sent in parallel to the ECC block via the four channels CH1, CH2, CH3, and CH4. At the same time, syndromes of the channel data #5, #6, #7, and #8 may be determined by the syndrome determining units, respectively. Further, at the time T2, KES operations may be performed with reference to syndromes of the channel data #1, #2, #3, and #4. If the KES operations of the channel data #1, #2, #3, and #4 are completed, at a time t4, Chien search operations of the channel data channel data #1, #2, #3, and #4 may commence at the same time.

At a time T3, KES operations of the channel data #5, #6, #7, and #8 may commence. At a time t6 when Chien search operations of the channel data #1, #2, #3, and #4 are ended, error correction of the channel data #1, #2, #3, and #4 may be made. At a time t7, error-corrected data may be sent to a host side.

As illustrated in FIG. 12A, at a time t5, Chien search operations of the channel data #1, #2, #3, and #4, KES operations of the channel data #5, #6, #7, and #8, and syndrome determination of channel data #9, #10, #11, and #12 may be made at the same time. Power consumption may be highest at the Chien search operations. For example, a peak current is generated at a time t5.

Figure 12B:
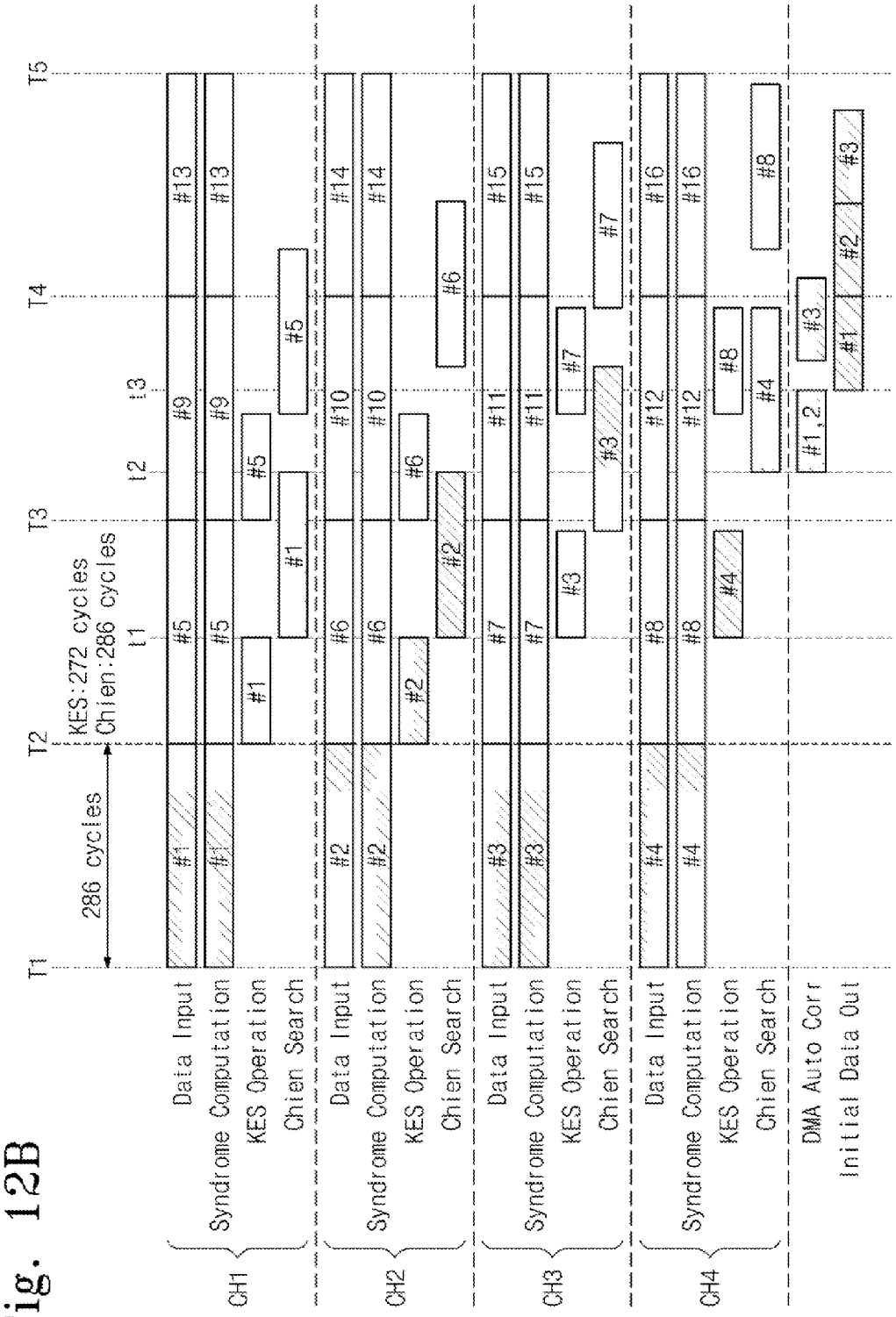
FIG. 12B is a timing diagram illustrating an error correcting operation when KES units and Chien search units are independent of the channels.

FIG. 12B is a timing diagram illustrating an error correcting operation when KES units and Chien search units are independent of the channels.

Referring to FIG. 12B, channel data #1, #2, #3, and #4 read from memory devices may be sent in parallel to an ECC block 121a via four channels CH1, CH2, CH3, and CH4 from a time T1. At the same time, syndromes of the channel data #1, #2, #3, and #4 may be determined by syndrome determining units, respectively. An input of the channel data #1, #2, #3, and #4 and a syndrome determining operation may be ended at a time T2.

At the time T2, channel data #5, #6, #7, and #8 read from memory devices may be sent in parallel to the ECC block via the four channels CH1, CH2, CH3, and CH4. At the same time, syndromes of the channel data #5, #6, #7, and #8 may be determined by the syndrome determining units, respectively.

At the time T2, KES operations may be performed with reference to syndromes of the channel data #1, #2, #3, and #4. In particular, a KES block 420 according to an exemplary embodiment of the inventive concept may include two KES units KESU_1 and KESU_2. Accordingly, KES operations of channel data #1 and #2 may be assigned to the KES units KESU_1 and KESU_2, which remain at a ready state before a time T2. While the KES operations of the channel data #1 and #2 are being performed, the KES units KESU_1 and KESU_2 may maintain a busy state.

At a time t1, the KES operations of the channel data #1 and #2 may be ended. If the KES operations of the channel data #1 and #2 are ended, the KES operations of the channel data #3 and #4 may commence. At a time t1, the KES operations of the channel data #3 and #4 may commence, and Chien search operations of the channel data #1 and #2 may be carried out at the same time. The Chien search operations of the channel data #1 and #2 may be carried out by two Chien search units selected from the Chien search units ChienSU_1, ChienSU_3, and ChienSU_3.

The Chien search operations of the channel data #1 and #2 may be ended at a time t2. But, while the Chien search operations of the channel data #1 and #2 are being performed, the KES operations of the channel data #3 and #4 may be ended. Accordingly, a Chien search operation of the channel data #3 may be performed by a Chien search unit of a ready state selected from the Chien search units ChienSU_1, ChienSU_3, and ChienSU_3. A Chien search operation of the channel data #4 may commence at a time t2 when the Chien search operations of the channel data #1 and #2 are ended.

Error correction of the channel data #1 and #2 may be made at a time t2 when the Chien search operations of the channel data #1 and #2 are ended. Error-corrected data may be output to a host side from a time t3 when error correction of the channel data #1 and #2 is ended.

With the error correcting operation described of FIG. 12B, the case that syndrome determining operations, KES operations, and Chien search operations associated with all channels are not simultaneously performed and a peak current generated at an ECC block may be maintained low as compared to the case of simultaneous operations. Further, an initial data output time, when error-corrected data is provided to a host side, may be hastened.

Figure 13:
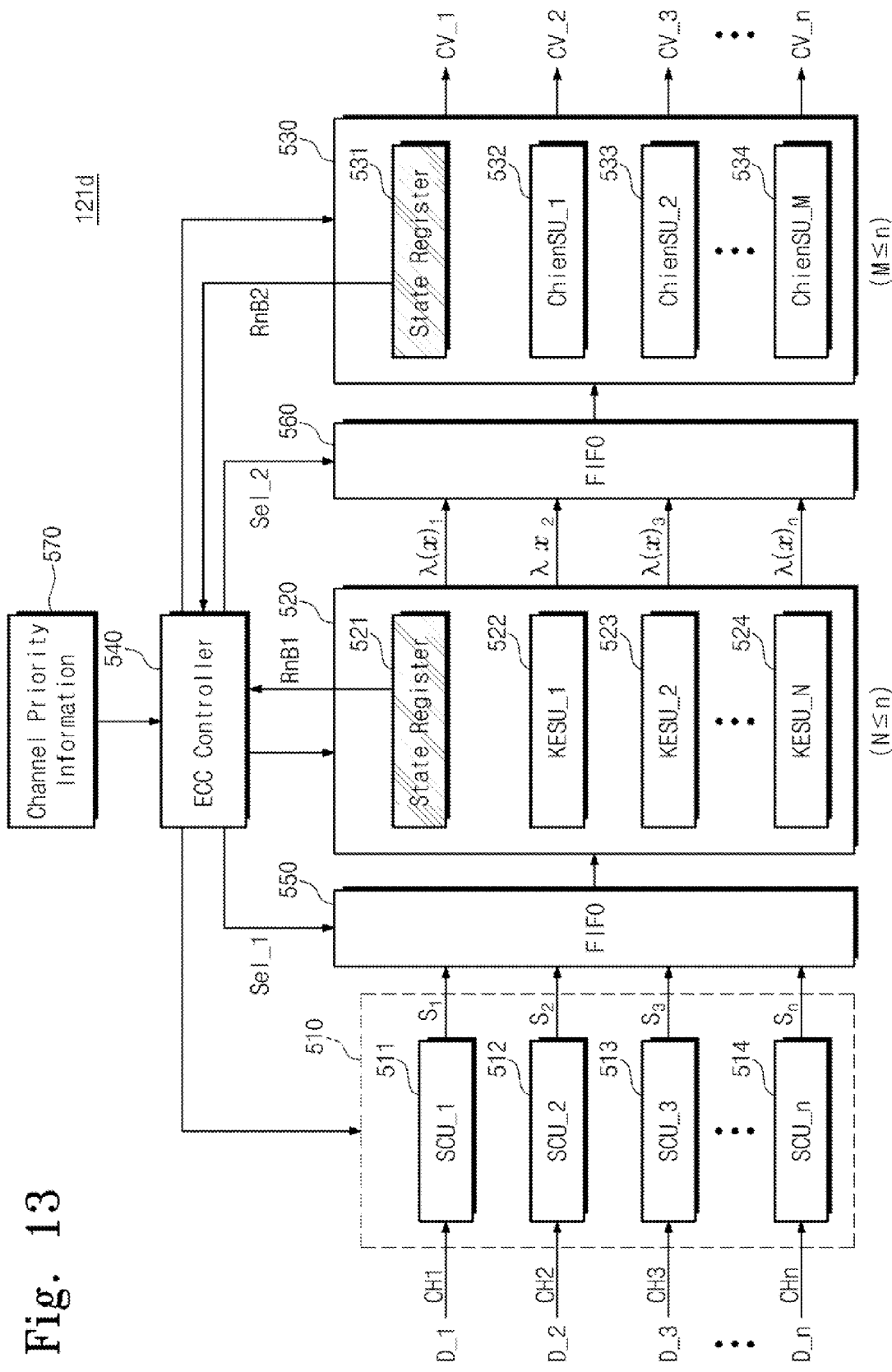
FIG. 13 is a block diagram illustrating an ECC block of FIG. 2 according to an exemplary embodiment of the inventive concept.

FIG. 13 is a block diagram illustrating an ECC block of FIG. 2 according to an exemplary embodiment of the inventive concept. Referring to FIG. 13, the ECC block 121d may include a syndrome determination block 510, a KES block 520, a Chien search block 530, an ECC controller 540, FIFO buffers 550 and 560, and a channel priority information block 570.

The syndrome determination block 510 may include a plurality of syndrome determination units (represented by SCU_1 to SCU_n of FIG. 13) 511 to 514. Each of the syndrome determination units 511 to 514 may determine a syndrome of data transferred via a corresponding channel. The syndrome determination unit (SCU_1) 511 may determine a syndrome of channel data D_1 transferred via a first channel CH1. The syndrome determination unit (SCU_2) 512 may determine a syndrome of channel data D_2 transferred via a second channel CH2. The syndrome determination unit (SCU_3) 513 may determine a syndrome of channel data D_3 transferred via a third channel CH3. As described above, each of the syndrome determination units 511 to 514 may determine a syndrome of channel data transferred via a corresponding channel. Herein, each of the syndrome determination units 511 to 514 may be formed of one processing element.

The syndromes S1 to Sn of the channel data D_1 to D_n determined by the syndrome determination block 510 may be transferred to the FIFO buffer 550. The syndromes 51 to Sn stored in the FIFO buffer 550 may be transferred to the KES block 520 in an input order.

The KES block 520 may obtain error location polynomials based upon the syndromes S1 to Sn. The KES block 520 may be implemented by an Euclidean method, a Modified Euclidean (ME) method, or a Berlecamp-Massay (BM) method.

The KES block 520 may include a state register 521 and a plurality of KES units (represented by KESU_1 to KESU_N) 522 to 524. The state register 521 may store driving states (e.g., RnB bits and channel information) of the plurality of KES units 522 to 524. The state register 421 may provide driving states of the plurality of KES units 522 to 524 to the ECC controller 540 in real time.

For example, among the plurality of KES units 522 to 524, an RnB bit of the state register 521 corresponding to one currently determining an error location polynomial may set to a busy state (or, logically '0'). Channel information of channel data being currently determined by each of the plurality of KES units 522 to 524 may be stored in the state register 521. RnB bits of the state register 521 corresponding to unused KES units of the plurality of KES units 522 to 524 may be set to a ready state (or, logically '1'), and channel information of the unused KES units may be set to a reset state.

If channel data determined to be erroneous among the syndromes S1 to Sn is provided, the ECC controller 540 may select one of the plurality of KES units 522 to 524 based upon RnB bits of the state register 521. The selected KES unit KESU_x may obtain an error location polynomial of the erroneous data. An RnB bit corresponding to the selected KES unit KESU_x may be switched to a busy state. According to the above-described method, the number of KES units 522 to 524 of the KES block 520 may be less than that of channels CH1 to CHn. Each of the KES units 522 to 524 may be used to obtain error location polynomials of various channel data as occasion demands, not fixed to any one channel.

If the above-described KES block 520 is used, it is possible to solve a waiting problem caused when channel data determined to be normal is synchronized with error correction operations of remaining channels. That is, an operation of obtaining an error location polynomial may be carried out with respect to a channel where an error exists. The number of erroneous bits of respective channel data may be different. In this case, the number of clock cycles needed for a KES determination may be different according to the number of erroneous bits. A driving efficiency may be improved by performing a KES determination independent of the channels.

The error location polynomials $\lambda(x)1$ to $\lambda(x)n$ of the channel data D_1 to D_n generated by the KES block 520 may be transferred to the FIFO buffer 560. The error location polynomials $\lambda(x)1$ to $\lambda(x)n$ stored in the FIFO buffer 560 may be transferred to the Chien search block 530 in an input order.

The Chien search block 530 may determine roots of the error location polynomials. The Chien search block 530 may include a state register 531 and a plurality of Chien search units (represented by ChienSU_1 to ChienSU_M of FIG. 13) 532 to 534. The state register 531 may store driving states (e.g., RnB bits and channel information) of the Chien search units 532 to 534. The state register 431 may provide driving states of the Chien search units 532 to 534 to the ECC controller 540 in real time.

The Chien search units 532 to 534 may determine roots of error location polynomials $\lambda(x)1$ to $\lambda(x)n$ each corresponding to channel data. The ECC controller 540 may assign error location $\lambda(x)1$ to $\lambda(x)n$ to the Chien search units 532 to 534 based upon the RnB bits and channel information of the state register 531. The RnB bits of the state register 531 may be maintained at a ready state before an error location unit is assigned to a Chien search unit. When Chien search units are assigned to determine error location polynomials, RnB bits of the state register 531 may be switched to a busy state and channel information corresponding to switched bits may be set. If a root of an error location polynomial is obtained by an assigned Chien search unit, an RnB bit of the state register 531 corresponding to the assigned Chien search unit may be switched to a ready state and channel information corresponding to the assigned Chien search unit may be reset.

According to the above-described method, the number of Chien search units 532 to 534 of the Chien search block 530 may be less than the number of channels. Each of the Chien search units 532 to 534 may be used to obtain roots of error location polynomials of various channel data as occasion demands, not fixed to any one channel. The number of clock cycles needed by a Chien search operation may vary according to error location. When the number of erroneous bits on different channels vary, efficiency may be improved by configuring the Chien search units 532 to 534 to be independent of the channels.

The ECC controller 540 may control the syndrome determination block 510, the KES block 520, and the Chien search block 530 so as to perform error detecting and correcting operations of channel data provided from a storage medium 110 of FIG. 1. The ECC controller 540 may refer to updated ready/busy states of the state registers 521 and 531 to control the KES block 520 and the Chien search block 530. That is, when obtaining error location polynomials and roots of error location polynomials, the ECC controller 540 may assign processing operations with reference to the KES units 522 to 524 and the Chien search units 532 to 434.

The ECC controller 540 may control an output order of the FIFO buffers 550 and 560 with reference to the channel priority information block 570. Priority information of channel data may be stored in the channel priority information block 570. The ECC controller 540 may control an output order of syndromes S1 to Sn input to the FIFO buffer 550 with reference to channel priority. The ECC controller 540 may control an output order of error location polynomials $\lambda(x)1$ to $\lambda(x)n$ input to the FIFO buffer 560 with reference to channel priority.

In FIG. 13, there is exemplarily illustrated the case that the FIFO buffers 550 and 560 are all controlled by the ECC controller 540. However, the inventive concept is not limited thereto. For example, the ECC control 540 may be configured to control the FIFO buffer 550 with reference to the channel priority information block 570. Alternatively, the ECC control 540 may be configured to control the FIFO buffer 560 with reference to the channel priority information block 570.

The channel priority information block 570 may be formed of a storage means configured to receive channel priority from a user. For example, the channel priority information block 570 may be formed of a nonvolatile memory element or a volatile memory element.

Figure 14:
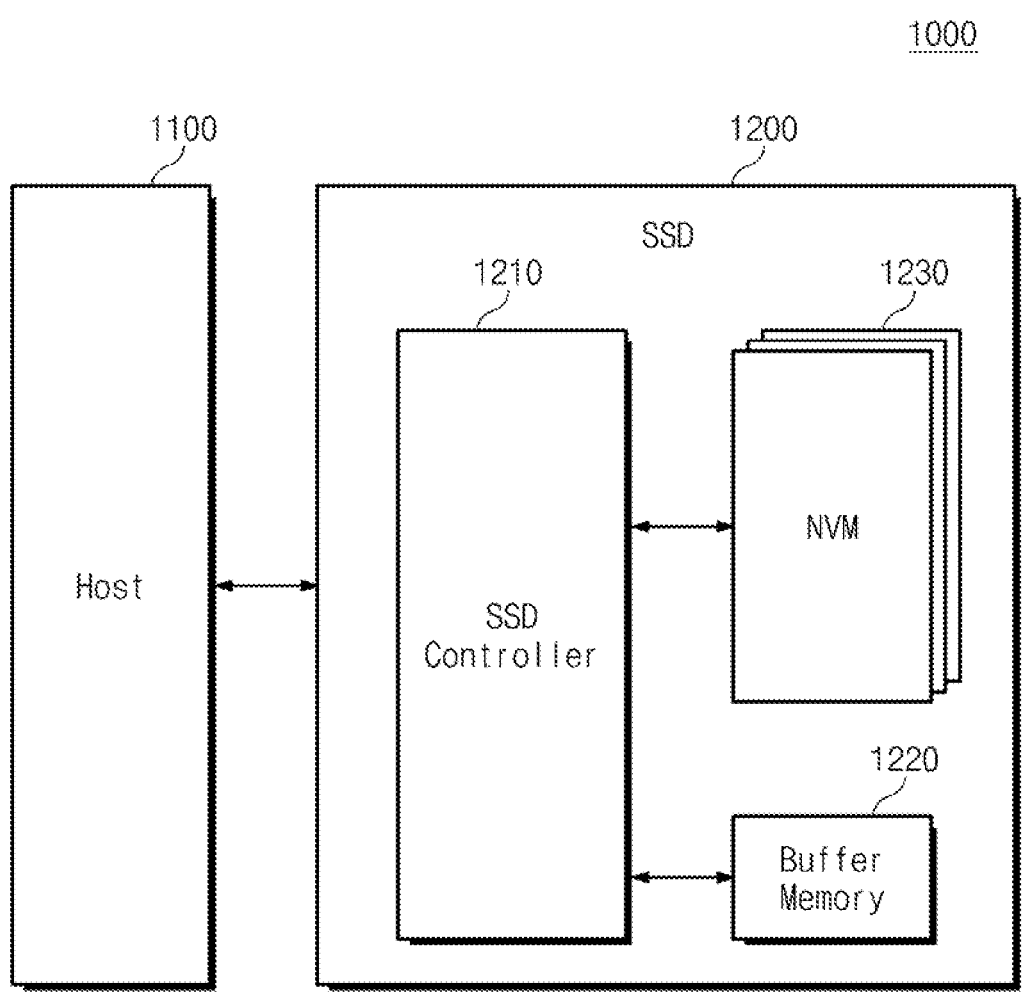
FIG. 14 is a block diagram illustrating an SSD including a nonvolatile memory device according to an exemplary embodiment of the inventive concept.

FIG. 14 is a block diagram illustrating an SSD including a nonvolatile memory device according to an exemplary embodiment of the inventive concept. Referring to FIG. 14, an SSD system 1000 may include a host 1100 and an SSD 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100. The SSD controller 1210 may access the nonvolatile memory device 1230 according to the decoding result. The bus format of the host 1100 may include USB (Universal Serial Bus), SCSI (Small Computer System Interface), PCI-E, ATA, PATA (Parallel ATA), SATA (Serial ATA), SAS (Serial Attached SCSI), and the like.

The SSD controller 1210 may include an ECC block, which is driven independently from channels connected with the nonvolatile memory device 1230. The ECC block may include a KES block or/and a Chien search block, the operating time of which is assigned according to a driving state independent of the channels.

The buffer memory 1220 may temporarily store write data provided from the host 1100 or data read out from the nonvolatile memory device 1230. In the event that data existing in the nonvolatile memory device 1230 is cached at a read request of the host 1100, the buffer memory 1220 may support a cache function of providing cached data directly to the host 1100. A data transfer speed of a bus format (e.g., SATA or SAS) of the host 1100 may be higher than that of a memory channel of the SSD 1200. That is, in the event that an interface speed of the host 1100 is fast, lowering of the performance due to a speed difference may be reduced by providing the buffer memory 1220 having a large storage capacity.

The buffer memory 1220 may be formed of a synchronous DRAM to provide buffering to the SSD 1200 for use as a mass auxiliary storage device. However, the buffer memory 1220 is not limited to the memory devices described herein.

The nonvolatile memory device 1230 may be provided as a storage media of the SSD 1200. For example, the nonvolatile memory device 1230 may be formed of a NAND flash memory device having a mass storage capacity. The nonvolatile memory device 1230 may be formed of a plurality of memory devices. In this case, memory devices may be connected with the SSD controller 1210 by a channel unit. The nonvolatile memory device 1230 is not limited to a NAND flash memory device. For example, PRAM, MRAM, ReRAM, FRAM, NOR flash memory, etc. may be used as a storage media of the SSD 1200. Further, the inventive concept may be applied to a memory system, which uses different types of memory devices together. A volatile memory device (e.g., DRAM) can be used as a storage media.

Figure 15:
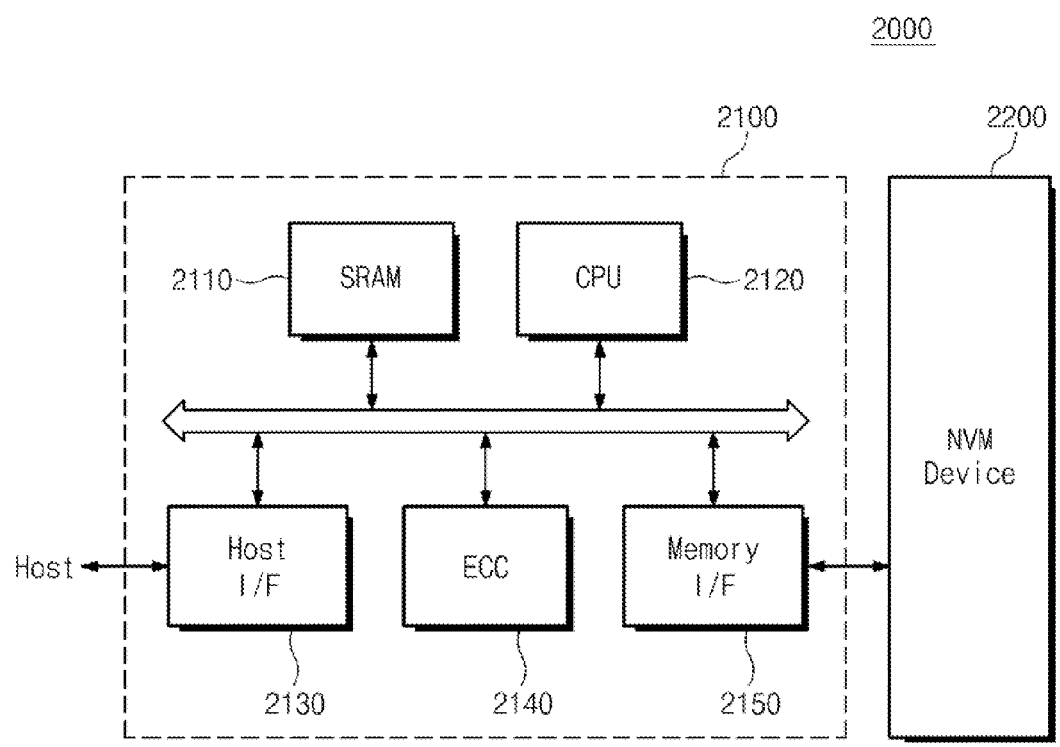
FIG. 15 is a block diagram illustrating a memory system according to an exemplary embodiment of the inventive concept.

FIG. 15 is a block diagram illustrating a memory system according to an exemplary embodiment of the inventive concept. Referring to FIG. 15, a memory system may include a nonvolatile memory device 2200 and a memory controller 2100.

The memory controller 2100 may be configured to control the nonvolatile memory device 2200. The nonvolatile memory device 2100 and the memory controller 2100 may constitute a memory card or a solid state drive (SSD). SRAM 2110 may be used as a working memory of CPU 2120. A host interface 2130 may include a data exchange protocol of a host connected with the memory system 2000. An ECC block 2140 may be configured to detect and correct errors included in data read out from the nonvolatile memory device 2200. A memory interface 2150 may interface with the nonvolatile memory device 2200 according to an exemplary embodiment of the inventive concept. The CPU 2120 may execute an overall control operation for data exchange of the memory controller 2100. Although not shown in FIG. 15, the memory system 200 may further include ROM, which stores code data for interfacing with the host.

The ECC block 2140 may be formed of an ECC block, which is driven independently from channels coupled with the nonvolatile memory device 2200. The ECC block 2140 may include a KES block or/and a Chien search block, the operating time of which is assigned according to a driving state independent of the channels.

The nonvolatile memory device 2200 may be implemented by a multi-chip package including a plurality of flash memory chips. The memory system 2000 may be provided as a storage media having the high reliability and a low error generation probability. A flash memory device according to an exemplary embodiment of the inventive concept may be included within a memory system such as a solid state drive (SSD). In this case, the memory controller 2100 may communicate with an external device via one of interface protocols such as USB, MMC (MultiMediaCard), PCI-E, SAS, SATA, PATA, SCSI, ESDI (Enhanced Small Disk Interface), IDE (Integrated Drive Electronics), and the like. Further, the memory controller 2100 may further include a component for executing a random operation.

Figure 16:
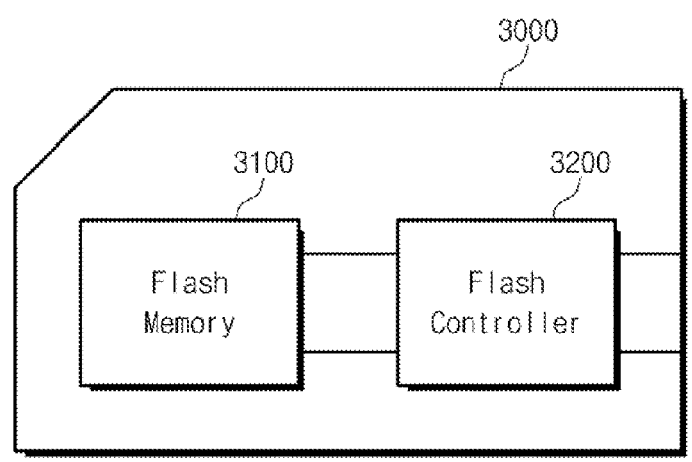
FIG. 16 is a block diagram illustrating a data storage device according to an exemplary embodiment of the inventive concept.

FIG. 16 is a block diagram illustrating a data storage device according to an exemplary embodiment of the inventive concept. Referring to FIG. 16, a data storage device 3000 may include a flash memory 3100 and a flash controller 3200. The flash controller 3200 may control the flash memory 3100 in response to control signals input from the outside of the data storage device 3000.

The flash controller 3200 may include an ECC block, which is driven independently from channels coupled with the flash memory 3100. The flash controller 3200 may include a KES block or/and a Chien search block, the operating time of which is assigned according to a driving state independent of the channels.

The data storage device 3000 may be a memory card device, an SSD device, a multimedia card device, an SD device, a memory stick device, a HDD device, a hybrid drive device, or an USB flash device. For example, the data storage device 3000 may be a card that satisfies a standard for using a user device such as a digital camera, a personal computer, and the like.

Figure 17:
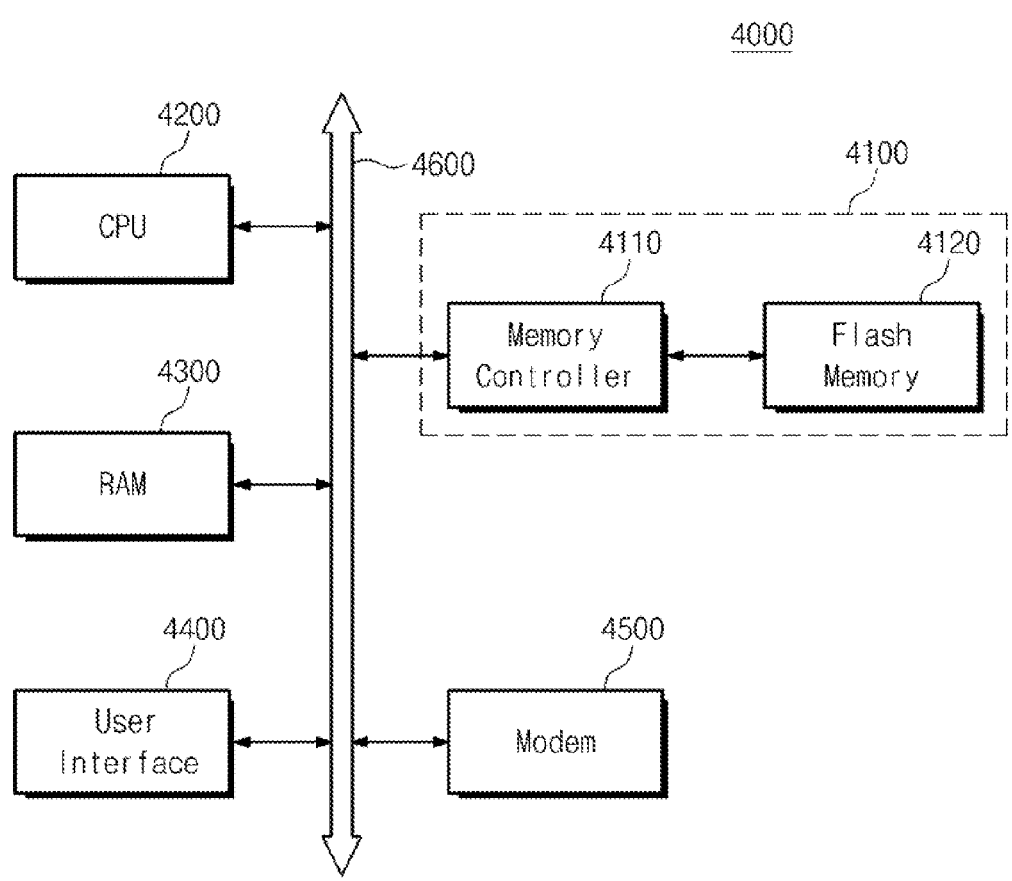
FIG. 17 is a block diagram illustrating a computing system including a nonvolatile memory device according to an exemplary embodiment of the inventive concept.

FIG. 17 is a block diagram illustrating a computing system including a nonvolatile memory device according to an exemplary embodiment of the inventive concept. A computing system 400 may include a CPU (or, a microprocessor) 4200, a random access memory (RAM) 4300, a user interface 4400, a modem 4500 such as a baseband chipset, and a memory system 4100 which are electrically connected with a system bus 4600. If the computing system 4000 is a mobile device, it may further include a battery (not shown), which may power the computing system 4000. Although not shown in FIG. 17, the computing system 4000 may further include an application chipset, a camera image processor (CIS), a mobile DRAM, and the like. The memory system 4100 may be configured the same as that in FIG. 14 or 15. The memory system 4100 may include a memory controller 4110 and a flash memory 4120. The memory system 4100 may be a solid state drive/disk (SSD) which uses a nonvolatile memory to store data. Alternatively, the memory system 4100 may be formed of a fusion flash memory (e.g., a One-NAND flash memory).

A nonvolatile memory device or a memory controller may be packaged using any of various technologies. For example, a nonvolatile memory device or a memory controller may be packaged as a PoP (Package on Package), Ball grid array (BGA), Chip scale package (CSP), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

As understood from the above description, it is possible to reduce the number of processing elements needed for error correction decoding of channel data transferred to a plurality of channels, and to output read-requested data rapidly.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An error correction code (ECC) decoder processing data read from a storage media, comprising:
a syndrome determination block configured to determine a syndrome for each of a plurality of channel data, wherein each of the plurality of channel data is received via a corresponding one of a plurality of channels;
a key equation solver (KES) block configured to obtain an error location polynomial for at least one of the plurality of channel data based upon the syndrome determined through the syndrome determination block;
a Chien search block configured to obtain a root of the error location polynomial for at least one of the plurality of channel data based upon the error location polynomial obtained through the key equation solver block; and
an ECC controller configured to control at least one of the syndrome determination block, KES block, and the Chien search block,
wherein the KES block comprises a plurality of KES units and a state register configured to store a ready/busy state for at least one of the plurality of KES units, wherein the ECC controller assigns each of the plurality of channel data to at least one of the plurality of KES units based on the state stored in the state register.

2. The ECC decoder of claim 1, further comprising:
a buffer configured to output the syndromes determined through the syndrome determination block to the KES block.

3. The ECC decoder of claim 1, wherein a number of the plurality of KES units is less than a number of the plurality of channels.

4. An error correction code (ECC) decoder processing data read from a storage media comprising:
a syndrome determination block configured to determine a syndrome for each of a plurality of channel data, wherein each of the plurality of channel data is received via a corresponding one of a plurality of channels;
a key equation solver block configured to obtain an error location polynomial for at least one of the plurality of channel data based upon the syndrome determined through the syndrome determination block;
a Chien search block configured to obtain a root of the error location polynomial for at least one of the plurality of channel data based upon the error location polynomial obtained through the key equation solver block; and
an ECC controller configured to control at least one of the syndrome determination block, KES block, and the Chien search block,
wherein the Chien search block comprises
a plurality of Chien search units and a state register configured to store a ready/busy state of each of the plurality of Chien search units,
wherein the ECC controller assigns each of the plurality of channel data to at least one of the plurality of Chien search units based on the state stored in the state register.

5. The ECC decoder of claim 1, further comprising:
a buffer configured to output the error location polynomials obtained through the KES block to the Chien search block.

6. The ECC decoder of claim 4, wherein a number of the plurality of Chien search units is less than a number of the plurality of channels.

7. The ECC decoder of claim 1, further comprising:
a channel priority information block configured to store priority information of the plurality of channels;
a first buffer configured to output the syndrome determined through the syndrome determination block to the KES block; and
a second buffer configured to output the error location polynomials obtained through the KES block to the Chien search block, wherein the ECC controller controls an output order of the first buffer and the second buffer according to the priority information.

8. The ECC decoder of claim 1, wherein the storage media includes at least one nonvolatile memory devices.

9. A method of correcting an error in data read out from a nonvolatile memory device, the method comprising:
receiving a plurality of channel data provided from a plurality of channels, wherein each of the plurality of channel data is received via a corresponding one of the plurality of channels;
determining a syndromes for each of the plurality of channel data;
obtaining an error location polynomial for at least one of the plurality of channel data based upon the determined syndrome; and
obtaining a root of the error location polynomial for at least one of the plurality of channel data based upon the obtained error location polynomial,
wherein the obtaining the error location polynomial comprises storing a state for each of a plurality of key equation solver (KES) units obtaining the error location polynomial and assigning each of the plurality of channel data to at least one of the plurality of KES units based on the stored state.

10. The method of claim 9, further comprising excluding at least one of the channel data upon from obtaining an error location polynomial or a root, based on a determination such that a syndrome corresponding to the at least one channel data indicates no error.

11. A method of correcting an error in data read out from a nonvolatile memory device, the method comprising:
receiving a plurality of channel data provided from a plurality of channels, wherein each of the plurality of channel data is received via a corresponding one of the plurality of channels;
determining a syndrome for each of the plurality of channel data;
obtaining an error location polynomial for at least one of the plurality of channel data based upon the determined syndrome; and
obtaining a root of the error location polynomial for at least one of the plurality of channel data based upon the obtained error location polynomial,
wherein the obtaining the error location polynomial comprises storing a state for each of a plurality of Chien search units obtaining the error location polynomial and assigning each of the plurality of channel data to at least one of the plurality of Chien search units based on the stored state.

* * * * *